(12) United States Patent
Wang et al.

(10) Patent No.: US 11,765,837 B2
(45) Date of Patent: *Sep. 19, 2023

(54) METHOD AND APPARATUS FOR FLEXIBLE CIRCUIT CABLE ATTACHMENT

(71) Applicant: Jabil Inc., St. Petersburg, FL (US)

(72) Inventors: Wenlu Wang, St. Petersburg, FL (US); Mark A. Tudman, St. Petersburg, FL (US); Michael Piring Santos, St. Petersburg, FL (US); Ross Kristensen Benz, St. Petersburg, FL (US); Hien Ly, St. Petersburg, FL (US); Gary Fang, St. Petersburg, FL (US)

(73) Assignee: Jabil Inc., St. Petersburg, FL (US)

( * ) Notice: Subject to any disclaimer, the term of this patent is extended or adjusted under 35 U.S.C. 154(b) by 51 days.

This patent is subject to a terminal disclaimer.

(21) Appl. No.: 17/504,812

(22) Filed: Oct. 19, 2021

(65) Prior Publication Data

US 2022/0095463 A1 Mar. 24, 2022

Related U.S. Application Data

(60) Continuation of application No. 17/038,982, filed on Sep. 30, 2020, now Pat. No. 11,191,169, which is a
(Continued)

(51) Int. Cl.
*H05K 3/36* (2006.01)
*H05K 3/34* (2006.01)
(Continued)

(52) U.S. Cl.
CPC ......... *H05K 3/3494* (2013.01); *B23K 20/007* (2013.01); *B23K 20/025* (2013.01);
(Continued)

(58) Field of Classification Search
CPC ...... H05K 3/3494; H05K 3/361; H05K 3/363; H05K 2203/166
See application file for complete search history.

(56) References Cited

U.S. PATENT DOCUMENTS

| 4,682,828 A | 7/1987 | Piper et al. |
| 5,747,358 A | 5/1998 | Gorrell et al. |
| (Continued) | | |

FOREIGN PATENT DOCUMENTS

| CN | 102648668 A | 8/2012 |
| JP | 2000150015 A | 5/2000 |
| (Continued) | | |

OTHER PUBLICATIONS

First Chinese Office Action with English translation in corresponding Chinese Patent Application No. 201780068352.2, dated Sep. 3, 2021.

*Primary Examiner* — Scott W Dodds
(74) *Attorney, Agent, or Firm* — Young Basile Hanlon & MacFarlane, P.C.

(57) ABSTRACT

A method and apparatus for multiple flexible circuit cable attachment is described herein. Gold bumps are bonded on interconnection pads of a substrate to create a columnar structure and solder or conductive epoxy is dispensed on the flexible cable circuit. The substrate and flexible cable circuit are aligned and pressed together using force or placement of a weight on either the substrate or flexible cable circuit. Appropriate heat is applied to reflow the solder or cure the epoxy. The solder wets to the substrate pads, assisted by the gold bumps, and have reduced bridging risk due to the columnar structure. A nonconductive underfill epoxy is applied to increase mechanical strength.

20 Claims, 24 Drawing Sheets

Related U.S. Application Data continuation of application No. 16/561,998, filed on Sep. 5, 2019, now Pat. No. 10,813,230, which is a division of application No. 15/344,101, filed on Nov. 4, 2016, now Pat. No. 10,448,517.

(51) Int. Cl.

| | |
|---|---|
| *H01L 23/00* | (2006.01) |
| *B23K 20/02* | (2006.01) |
| *B23K 20/233* | (2006.01) |
| *H01L 21/84* | (2006.01) |
| *H05K 1/11* | (2006.01) |
| *B23K 20/00* | (2006.01) |
| *B23K 20/24* | (2006.01) |
| *B23K 35/02* | (2006.01) |
| *B23K 35/30* | (2006.01) |
| *H05K 3/32* | (2006.01) |
| *H05K 3/40* | (2006.01) |
| *H05K 13/00* | (2006.01) |
| *B23K 101/42* | (2006.01) |
| *B23K 103/08* | (2006.01) |
| *B32B 37/06* | (2006.01) |

(52) U.S. Cl.
CPC ............ *B23K 20/233* (2013.01); *B23K 20/24* (2013.01); *B23K 35/0222* (2013.01); *B23K 35/3013* (2013.01); *H01L 21/84* (2013.01); *H01L 24/80* (2013.01); *H05K 1/111* (2013.01); *H05K 1/117* (2013.01); *H05K 3/321* (2013.01); *H05K 3/361* (2013.01); *H05K 3/363* (2013.01); *H05K 3/4015* (2013.01); *H05K 13/0015* (2013.01); *B23K 2101/42* (2018.08); *B23K 2103/08* (2018.08); *B32B 37/06* (2013.01); *H05K 2203/049* (2013.01); *H05K 2203/166* (2013.01); *Y02P 70/50* (2015.11); *Y02P 70/62* (2015.11)

(56) References Cited

U.S. PATENT DOCUMENTS

| | | |
|---|---|---|
| 5,786,270 A | 7/1998 | Gorrell et al. |
| 6,055,722 A | 5/2000 | Tighe et al. |
| 6,214,642 B1 | 4/2001 | Chen et al. |
| 2007/0187806 A1 | 8/2007 | Kim et al. |
| 2008/0241563 A1 | 10/2008 | Thammasouk et al. |
| 2009/0289362 A1 | 11/2009 | Rhyner et al. |
| 2012/0194101 A1 | 8/2012 | Kropp et al. |
| 2016/0050770 A1 | 2/2016 | Hwang et al. |

FOREIGN PATENT DOCUMENTS

| | | |
|---|---|---|
| JP | 2010118522 A | 5/2010 |
| JP | 2016004972 A | 1/2016 |

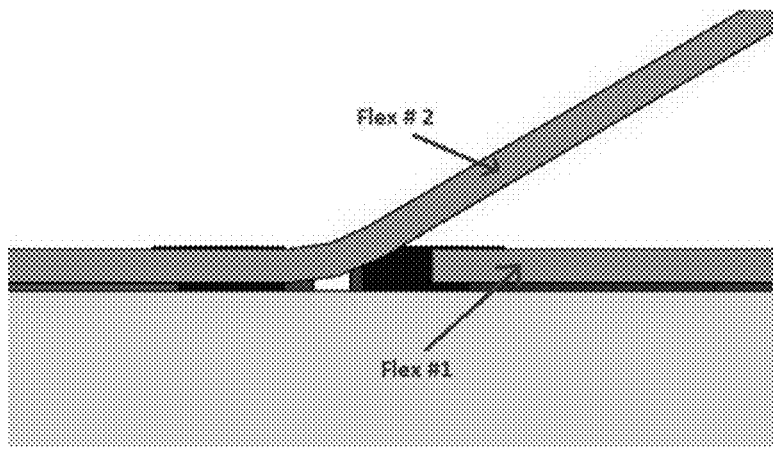
FIGURE 1, PRIOR ART
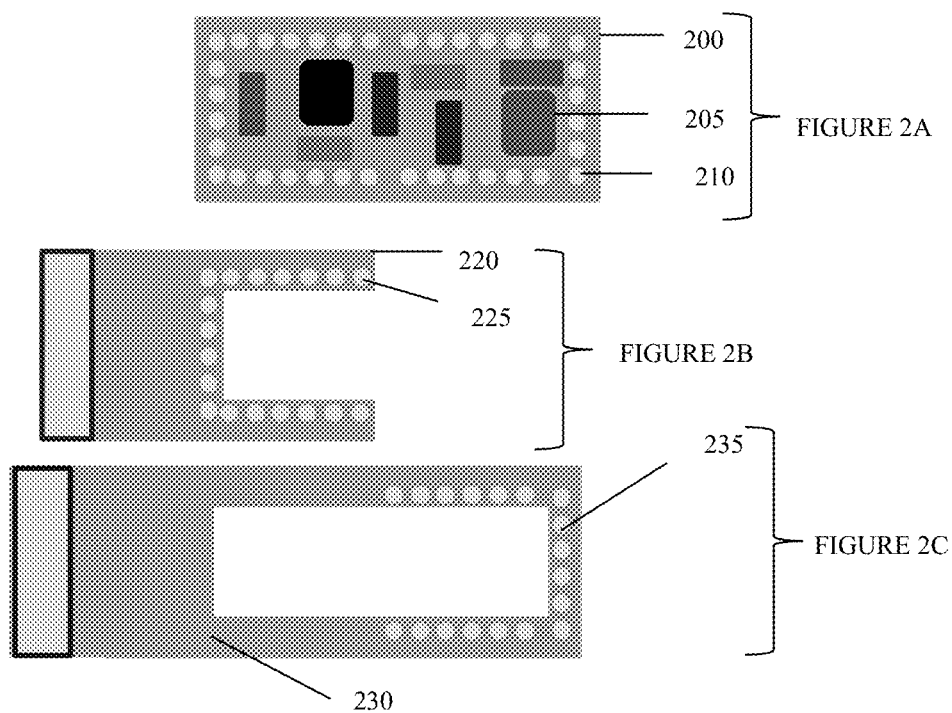

METHOD AND APPARATUS FOR FLEXIBLE CIRCUIT CABLE ATTACHMENT

CROSS-REFERENCE TO RELATION APPLICATION

This application is a continuation of U.S. patent application Ser. No. 17/038,982, filed Sep. 30, 2020, which is a continuation of U.S. patent application Ser. No. 16/561,998, filed Sep. 5, 2019, which is a divisional of U.S. patent application Ser. No. 15/344,101, filed Nov. 4, 2016, the entire disclosures of which are hereby incorporated by reference.

FIELD OF INVENTION

The present invention relates generally to flexible circuit cables and in particular, to attachment of flexible circuit cables to a substrate.

BACKGROUND

Flexible circuit cables are widely used in chip to printed circuit board (PCB), chip to substrate, optical sub assembly to PCB, and PCB to PCB interconnections. They provide high density signal routing capability in a limited space and flexible manner. However, previous methods for attaching the flexible circuit cables have a variety of disadvantages.

Direct soldering, for example, possible or preferable for single flexible circuit cable attachment or multiple flexible circuit cable attachment when the flexible circuit cables are non-overlapping. However, in overlapping flexible circuit cable scenarios, the heat reflow of the solder will impact the chips or flexible circuit cables that are already attached on the substrate. For example, as shown in FIG. 1, pre-attached cable or flexible circuit cable Flex #1 will be detrimentally affected when trying to attach flexible circuit cable Flex #2 using the direct soldering method. In scenarios when sequential flexible circuit cables need to overlap with the pre-attached cable or flexible circuit cable, (Flex #1), it is nearly impossible to wet the solder between the pads of the substrate and the second flexible circuit cable, (Flex #2). The gap created by the pre-attached cable or flexible circuit cable (Flex #1) interferes with placement of the second flexible circuit cable (Flex #2). The solder experiences difficulty in flowing between the flexible circuit cable and the substrate to create electrical connectivity and a lasting reliable bond.

The Anisotropic Conductive Film (ACF), and/or Anisotropic Conductive Paste (ACP) approach is widely used in flexible circuit cable to substrate and chip to flexible circuit cable attachments for liquid crystal display manufacturing. These processes also have several limitations. For example, these processes require the electrical pads to be embossed (raised) from the surface of the flexible circuit cable and substrate so that the conductive particles in the ACF or ACP can make contact through compression to create electrical connectivity in the Z direction. The ACF process also requires high thermal temperature to cure the film to create a bond. This high temperature can impact the chips or flexible circuit cable already attached on the substrate and therefore overlapping flexible circuit cable attachment becomes difficult with the ACF and/or ACP processes if there is a gap created by a previous attached flexible circuit cable or chips. Moreover, the conductive particle filled epoxies, traditionally used in ACP, usually have a high resistance and result in a limited radio frequency (RF) bandwidth.

Flexible circuit cable attachment can also be done using conductive epoxy. The conductive epoxy can be dispensed on the pads of the flexible circuit cable or substrate, prior to placement. Several issues exist with epoxy attachment including variance/planarity condition between the flexible circuit cable and substrate, under/over volume of epoxy, proper pressure control, limited reworkability, bond strength, and higher resistance than solder. Additionally, added complexity due to overlapping flexible circuit cables makes conductive epoxy even less attractive.

In summary, there are many challenges in attaching overlapping flexible circuit cables to a substrate, interposer or other structure. The attachment of the flexible circuit cable should not impact the assembled chips on the substrate or interposer. Any proposed method needs to overcome 1) the wetting issue between the flexible circuit cable and the substrate because of the gap formed by either previous assembled flexible circuit cables or chips, or the design of the flexible circuit cable and 2) co-planarity issue caused by pre-bending the flexible circuit cable, or unique shape such as U, S or open O shaped flexible circuit cables. The proposed method has to be operable in limited spaces, account for signal RF bandwidth and achieve low signal crosstalk for high bandwidth and high density signal trace on a single flexible cable circuit. For example, flexible circuit cable attachments are used in small assembly scenarios such as an optical sub assembly (OSA) used in pluggable transceivers, (Small form-factor pluggable transceiver (SFP, SFP+, QSFP), C form-factor pluggable (CFP, CFP2), and the like).

SUMMARY

A method and apparatus for flexible circuit cable attachment is described herein. Gold bumps are bonded on interconnection pads of a substrate and solder or conductive epoxy is printed or dispensed on the flexible circuit cable. Multiple gold bumps can be bonded onto each interconnection pad to create a column to restrict the path of solder or epoxy. The substrate and flexible circuit cable are aligned and pressed together using force or placement of a weight on either the substrate or flexible circuit cable. Appropriate heat is applied to reflow the solder or cure the epoxy. The solder wets to the interconnection pads, (as assisted by the gold bumps), and have reduced bridging risk from the column created by the multiple gold bumps on the interconnection pads. If conductive epoxy was printed or dispensed on the flexible circuit cable, then heat, ultraviolet (UV) light, or both can be applied to cure the epoxy between the flexible circuit cable and substrate. The epoxy has a reduced risk of being squeezed and smeared to neighboring pads because of the gap and volume created by the gold bumps. For added mechanical strength, a nonconductive underfill epoxy may be applied. Heat and capillary effect will draw the underfill epoxy in between the flexible circuit cable and substrate. The gold bumps create a standoff height, assisting in the underfill path, solder wicking, and reducing risk of bridging. Moreover, for high frequency applications, the multiple gold bumps result in improved radio frequency (RF) performance.

BRIEF DESCRIPTION OF THE DRAWINGS

A more detailed understanding may be had from the following description, given by way of example in conjunction with the accompanying drawings wherein:

FIG. 1 is a side view of direct soldering of a flexible circuit cable to a substrate with solder;

FIGS. 2A, 2B and 2C are examples of a substrate, a short form flexible circuit cable and a long form flexible circuit cable in accordance with an embodiment;

DETAILED DESCRIPTION OF THE EMBODIMENTS

Figure 3:
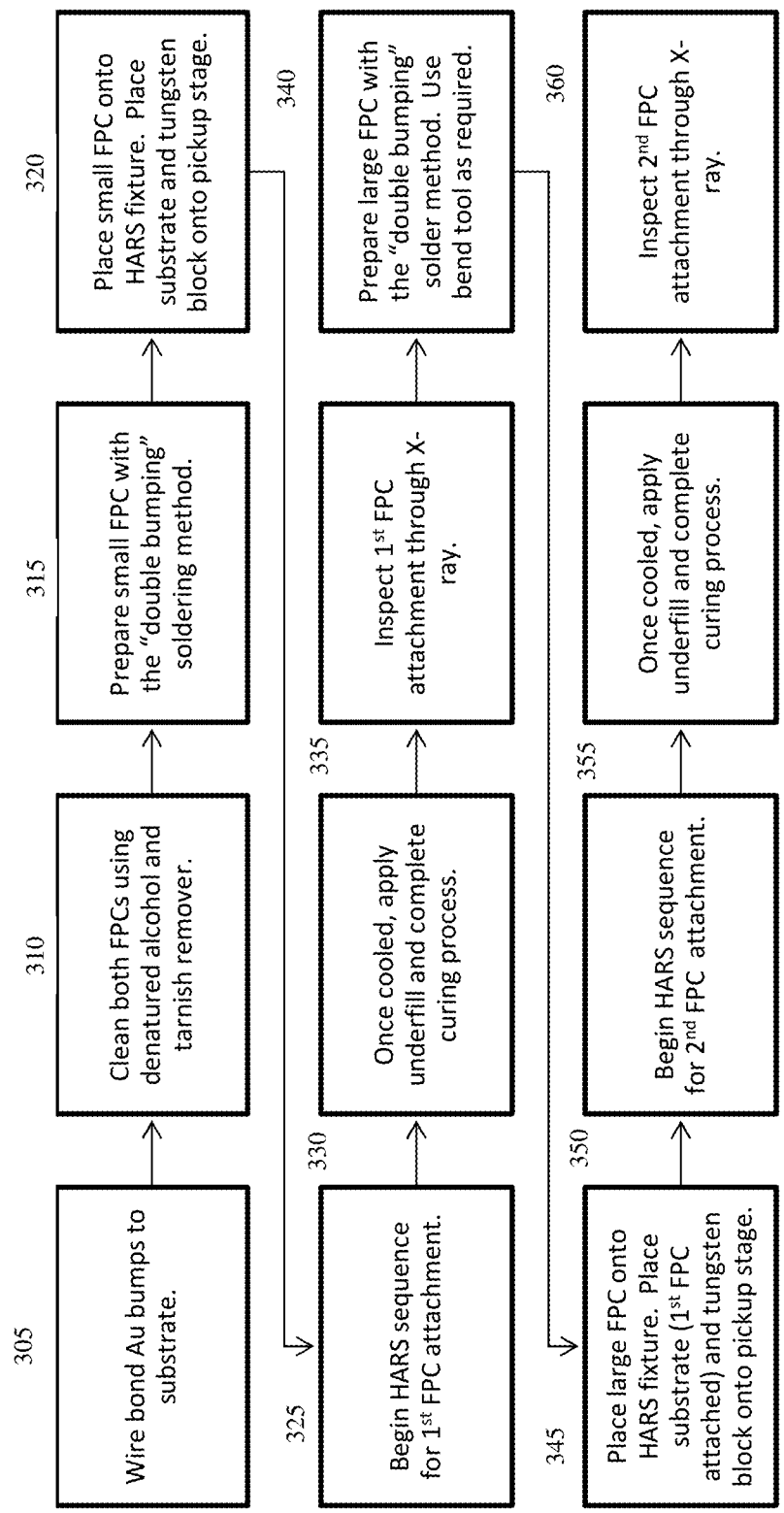
FIG. 3 is a top level flow diagram of attaching flexible circuit cables to a substrate in accordance with an embodiment.

It is to be understood that the figures and descriptions of embodiments of a method and apparatus for flexible circuit cable attachment have been simplified to illustrate elements that are relevant for a clear understanding, while eliminating, for the purpose of clarity, many other elements found in typical vehicle systems. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

The non-limiting embodiments described herein are with respect to a method and apparatus for flexible circuit cable attachment. The method and apparatus for flexible circuit cable attachment may be modified for a variety of applications and uses while remaining within the spirit and scope of the claims. The embodiments and variations described herein, and/or shown in the drawings, are presented by way of example only and are not limiting as to the scope and spirit. The descriptions herein may be applicable to all embodiments of the method and apparatus for flexible circuit cable attachment including, for example but not limited to, chip to printed circuit board (PCB) interconnection, chip to substrate interconnections, optical sub assembly to PCB interconnections, and PCB to PCB interconnections, for example.

Referring now to the drawings wherein similar reference numerals refer to similar elements across the several views, a method and apparatus for flexible circuit cable attachment is described. The embodiments described herein provide a solution for connecting flexible circuit cables and in some embodiments when multiple flexible circuit cables are overlapping, for example.

Described herein is an illustrative method which provides multiple gold bumps on interconnection pads located on a substrate. The gold bumps overcome a gap or variance between the substrate and flexible circuit cables when multiple flexible circuit cables are attached to the substrate and in particular, when the flexible circuit cables are overlapping. Moreover, the gold bumps provide increased wetting of solder from the flexible circuit cables to the substrate, a reduced risk of bridging or smearing, and a minimum bond gap, which allows for the use of underfill to increase mechanical strength. The flexible circuit cables also utilize a double solder bumping in some embodiments to increase the solder volume and to help compensate for the gaps between the flexible circuit cables and the substrate. A weight is used to keep the flexible circuit cables in close contact with the substrate during reflow and reduce the risk of open solder joints or head-in-pillow. Multiple fixtures were designed and developed as described herein.

In general and as further described herein below, interconnection pads on a substrate are provided with 1 or more gold (or copper) bumps. For example, each interconnection pad can have 3 to 9 gold (or copper) bumps. The bumps can be, for purposes of illustration, in a circular form or shape on the interconnection pad. Note, there is no limitation on the type of substrate, it can be silicon or glass interposer, LCD glass, or a regular PCB, another flex circuit, or even a chip with pads that can be gold (cu) bumped. A stencil print is used to deposit solder or dispense conductive epoxy on the flex circuit cable to be attached. The flexible circuit cable and substrate are aligned to each other and placed together. Pressure is applied through a force or a weight on top of the substrate or flexible circuit cable, whichever is on the top.

Heat is applied to reflow the solder or cure the epoxy. Solder will flow to the substrate with wetting assisted by the gold bumps and having reduced bridging risk from the columns created by the multiple gold (or copper) bumps on the substrate. In the event conductive epoxy was printed on the flexible circuit cable, then heat, ultraviolet (UV) light, or both can be applied to cure the epoxy between the flexible circuit cable and substrate. The epoxy has a reduced risk of being squeezed and smeared to neighboring pads because of the gap created by the gold (or copper) bumps. Once cooled, for increased mechanical strength, a nonconductive underfill epoxy is applied. Heat and capillary effect will draw the underfill epoxy in between the flexible circuit cable and substrate. After properly curing the underfill epoxy, the weight and or the pressure applied is removed.

The above can be repeated for each flexible circuit cable to be attached onto the substrate. The additional flexible circuit cable can be pre-bent with a bending jig to reduce downstream assembly complexity. The gold bumps on the substrate or flexible circuit cable can compensate for the standoff height created by the first flexible circuit cable, assisting in the underfill path, solder wicking, and reducing the risk of bridging. X-ray imaging, connectivity testing, and shear and pull testing can be performed to verify the mechanical integrity of the multiple flexible circuit cable attachments.

FIG. 2A is an illustrative example of a substrate 200. The substrate 200 can include components 205 and interconnection pads 210. The substrate can be, but is not limited to, single fused silicon (Si) glass substrate or any other type of similar material. Although the description herein is with respect to a substrate, the method can be applied to interposers, silicon or glass interposer, liquid crystal display (LCD) glass, a printed circuit board (PCB), another flexible circuit, a chip with pads that can be gold (copper) bumped and other interface modules.

FIG. 2B is an illustrative example of a flexible circuit cable 220 and in particular, a short form flexible circuit cable. The flexible circuit cable 220 has interconnection pads 225. FIG. 2C is an illustrative example of another flexible circuit cable 230 and in particular, a long form flexible circuit cable. The flexible circuit cable 230 has interconnection pads 235. The flexible circuit cables illustrated in FIGS. 2B and 2C are illustrative and other forms and shapes may be used without departing from the scope of the claims.

Figure 4:
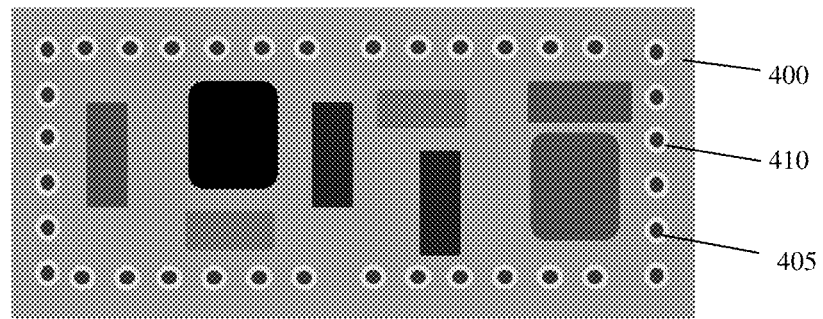
FIG. 4 is an example of a substrate with gold bumps in accordance with an embodiment.
Figure 5:
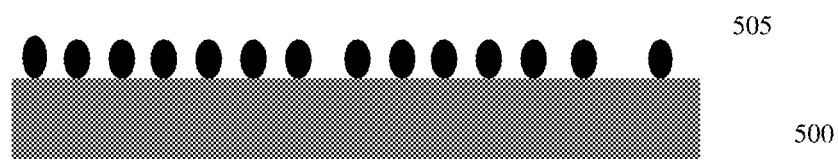
FIG. 5 is an example of a substrate with one layer of gold bumps in accordance with an embodiment.
Figure 6:
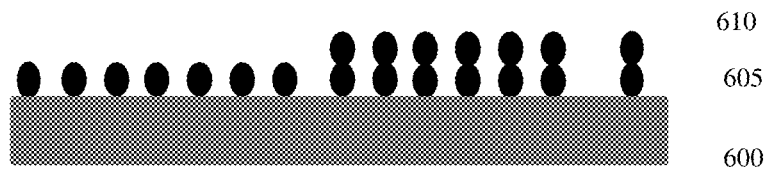
FIG. 6 is an example of a substrate with two stacks of gold bumps in accordance with an embodiment.

FIG. 3 is a top level flow diagram 300 of attaching flexible circuit cables to a substrate in accordance with an embodiment. Gold bumps are wire bonded to a substrate (305). In an embodiment, the bumps can be ultrasonically attached to the substrate. Any attachment method may be used that results in diffusion of the bump material into the substrate. Although the description herein is with respect to gold bumps, other materials may be used, such as for example, copper and aluminum. FIG. 4 shows a substrate 400 that has gold bumps 405 on interconnection pads 410 in accordance with an embodiment. FIG. 5 is an example of a substrate 500 with one stack of gold bumps 505 in accordance with an embodiment. FIG. 6 is an example of a substrate 600 with two stacks of gold bumps in accordance with an embodiment. A first stack of gold bumps 605 is wire bonded to interconnection pads that correspond to placement of a first and second flexible circuit cable and a second stack of gold bumps 610 is wire bonded to interconnection bonds that correspond to placement of the second flexible circuit cable. As stated herein, the gold bumps provide additional volume, standoff height to assist in providing an underfill path, solder wicking and reduced risk of bridging between interconnection pads. In addition, the bumps can serve to set a "standoff height" between the substrate and flexible circuit cable to ensure that solder is not forced out under attachment pressure.

Figure 7:
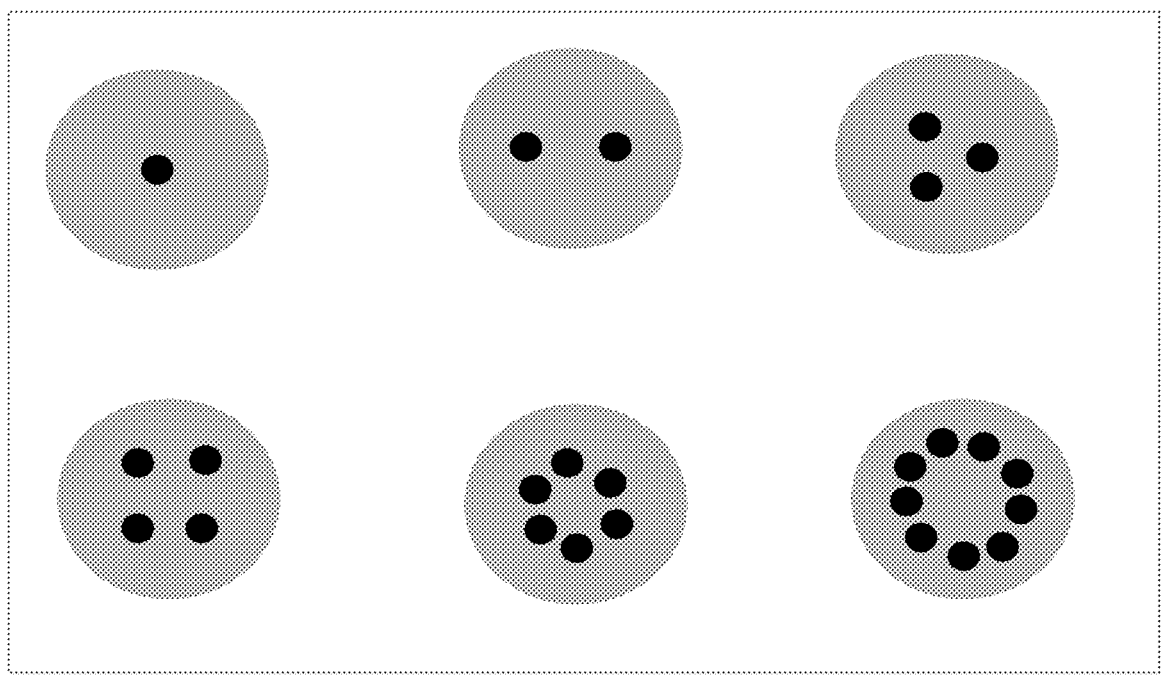
FIG. 7 are examples of different patterns for placing gold bumps on a substrate in accordance with various embodiments.
Figure 8:
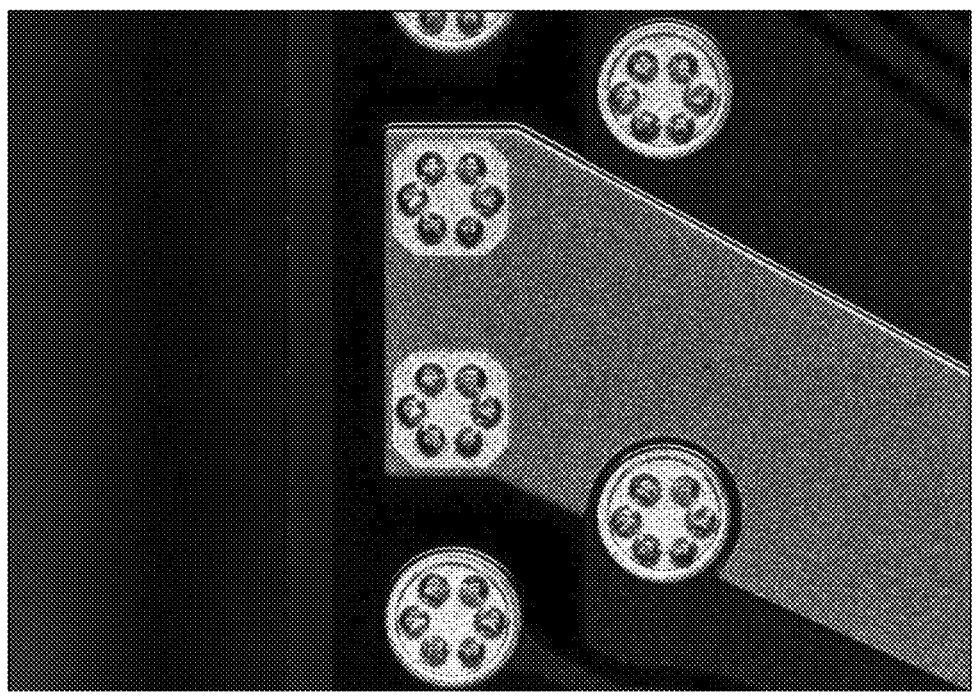
FIG. 8 is a photograph of a six gold bump pattern on a substrate in accordance with an embodiment.

FIG. 7 illustrates different patterns for placing gold bumps on a substrate in accordance with various embodiments including, but not limited to, one gold bump, two gold bumps, three gold bumps, four gold bumps, five gold bumps and six gold bumps. The gold bumps can be laid out in a variety of patterns and shapes, including but not limited to, circular patterns. The number of gold bumps is illustrative and can depend on the nature of substrate, available area, interconnection pad size and other similar considerations. FIG. 8 is a photograph of a six gold bump pattern on a substrate in accordance with an embodiment.

Figure 9A:
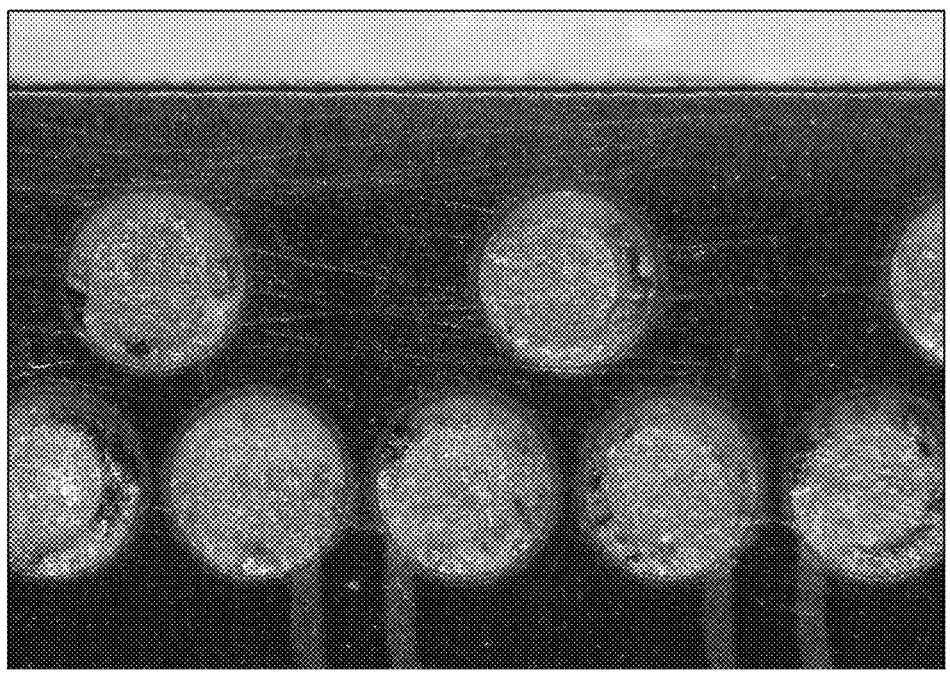
FIG. 9A shows an example of an uncleaned flexible circuit cable in accordance with an embodiment.
Figure 9B:
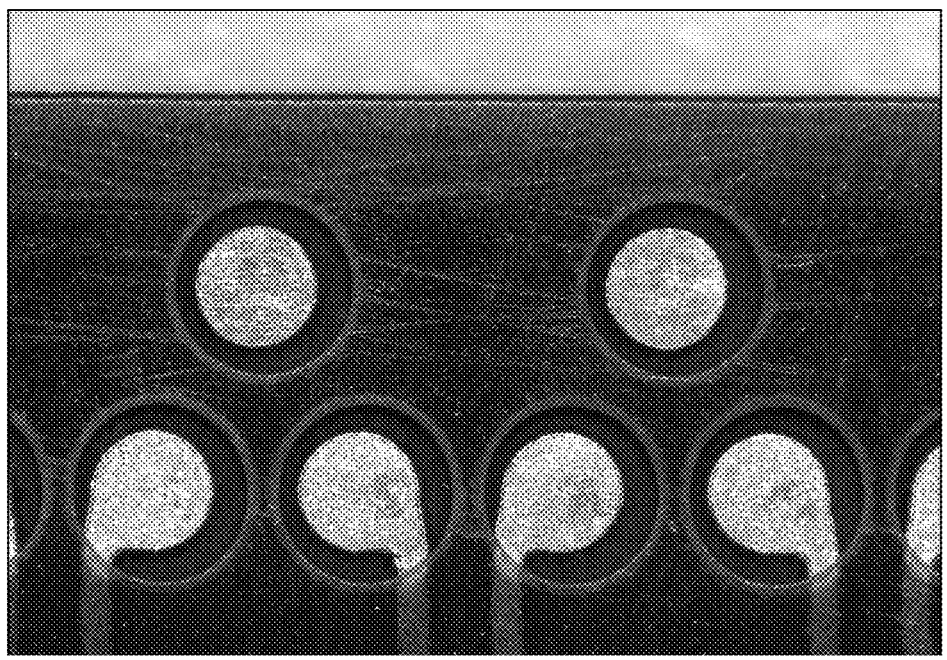
FIG. 9B shows an example of a cleaned flexible circuit cable in accordance with an embodiment.

Referring back to FIG. 3, the flexible circuit cables are cleaned (310). Each flexible circuit cable is placed or dipped into denatured alcohol for an appropriate amount of time to clean off contaminants. The placement in the denatured alcohol can be for approximately 15 seconds, for example. The flexible circuit cables are then placed in tarnish remover for an appropriate amount of time. The placement in the tarnish remover can be for approximately 3 minutes, for example. The tarnish remover with the flexible circuit cables can be agitated to encourage the cleansing process. The flexible circuit cables are then placed into a bag of denatured alcohol and the bag containing the flexible circuit cables are then positioned in an ultrasonic bath for an appropriate amount of time. The placement in the ultrasonic bath can be for approximately 10 minutes, for example. The flexible circuit cables are then removed and allowed to air dry. FIG. 9A shows an example of an uncleaned flexible cable circuit and FIG. 9B shows an example of a cleaned flexible circuit cable in accordance with an embodiment.

Referring back to FIG. 3, solder bumps are printed on a first flexible circuit cable (315). For purposes of illustration only, the first flexible circuit cable is a small form flexible circuit cable. In an embodiment, the solder paste is Tin-Bismuth, which has a low temperature melting point. A variety of solder pastes can be used as the selection of the solder paste is dependent upon the application and other similar factors. Although the description herein is with respect to a double bumping solder method, the number of solder bumps, including the use of a single solder bump, is dependent upon area, size and other similar factors. In another embodiment, solder or conductive epoxy are not necessary if using a diffusion bonding process such as thermal compression or ultrasonic bonding.

Figure 10:
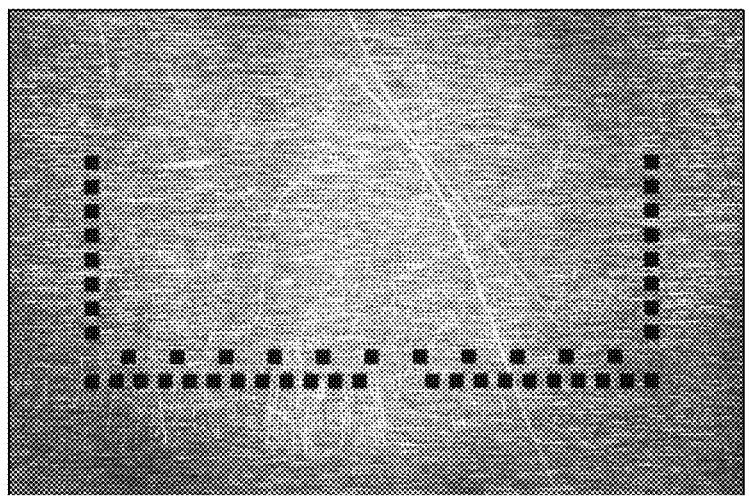
FIG. 10 is an example of a stencil used for printing solder on flexible circuit cable in accordance with an embodiment.
Figure 11:
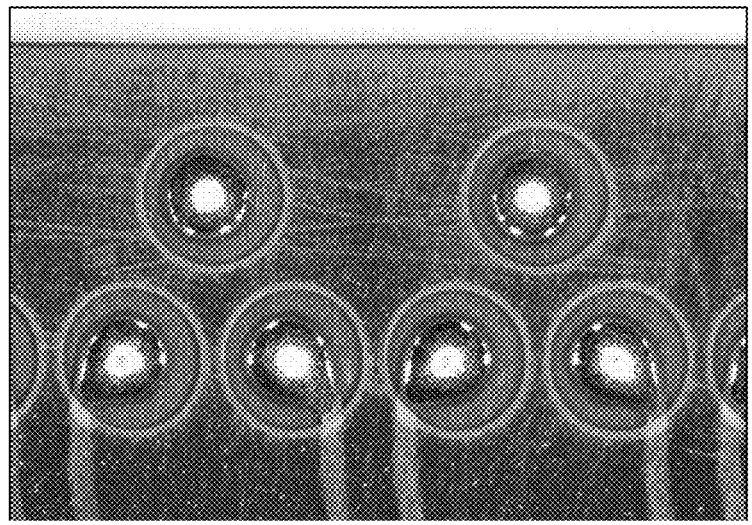
FIG. 11 is an example photograph of solder printed on the flexible circuit cable after a first reflow in accordance with an embodiment.
Figure 12:
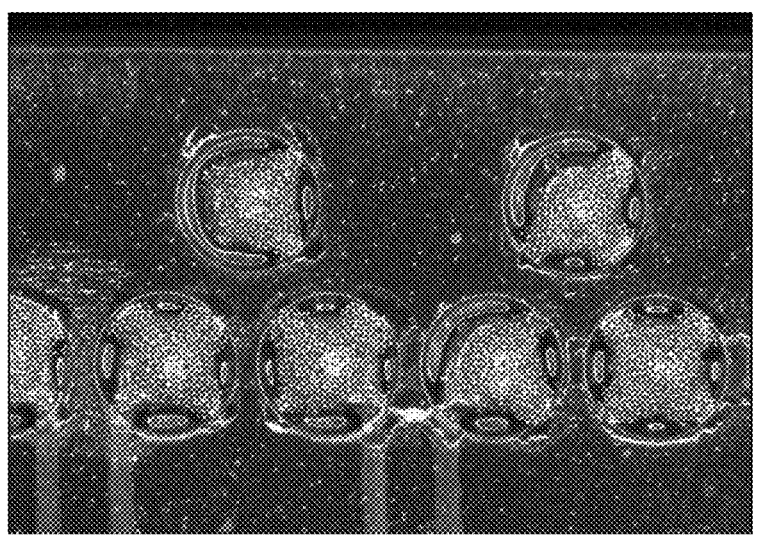
FIG. 12 is an example photograph of solder printed on the flexible circuit cable after a second reflow in accordance with an embodiment.

The solder paste is applied to the flexible circuit cable using a stencil. FIG. 10 is an example of the stencil used for printing solder on the flexible circuit cable in accordance with an embodiment. The flexible circuit cable with the solder paste is then placed onto a hotplate at a predetermined temperature. The predetermined temperature can be 250° C., for example. The flexible circuit cable can be removed from the hotplate once the solder paste has fully reflowed (i.e. melted) and allowed to cool. The flexible circuit cable is placed into denatured alcohol and an ultrasonic bath for a predetermined or appropriate amount of time. The predetermined or appropriate amount of time may be 10 minutes, for example. In an embodiment where double bumping is needed, solder paste is applied over the reflowed solder paste to additional solder volume using the stencil. FIG. 11 is an example photograph of solder printed on the flexible circuit cable after a first reflow in accordance with an embodiment and FIG. 12 is an example photograph of solder printed on the flexible circuit cable after a second reflow in accordance with an embodiment.

Figure 13:
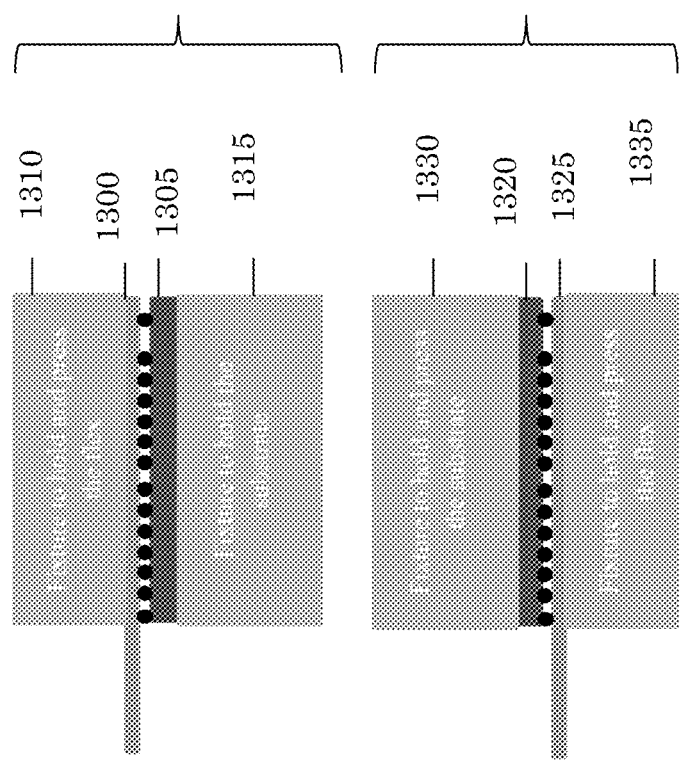
FIG. 13A shows an example of a flexible circuit cable being attached to a substrate in accordance with an embodiment.
FIG. 13B shows an example of a substrate being attached to a flexible circuit cable in accordance with an embodiment.

Referring back to FIG. 3, the first flexible circuit cable is placed onto a hot air reflow system (HARS) fixture (320). The substrate and a weight are placed onto a pickup stage. The flexible circuit cable and substrate are positioned as shown in either FIG. 13A or 13B. In particular, FIG. 13A shows an example of the flexible circuit cable 1300 being attached to a substrate 1305 where the flexible circuit cable 1300 is above the substrate 1305. Fixtures 1310 and 1315 are used to hold and press the flexible circuit cable 1300 and the substrate 1305 together, respectively. FIG. 13B shows an example of a substrate 1320 being attached to a flexible circuit cable 1325 where the substrate 1320 is above the flexible circuit cable 1325. Fixtures 1330 and 1335 are used to hold and press the flexible circuit cable 1320 and the substrate 1325 together, respectively. In an embodiment, the weight is cantilevered off of the flexible circuit cable to increase compression and bonding. After appropriate placement, the HARS sequence for the first flexible circuit cable and substrate in then initiated (325). A more detailed description of the HARS process is presented with respect to FIG. 24.

Figure 14:
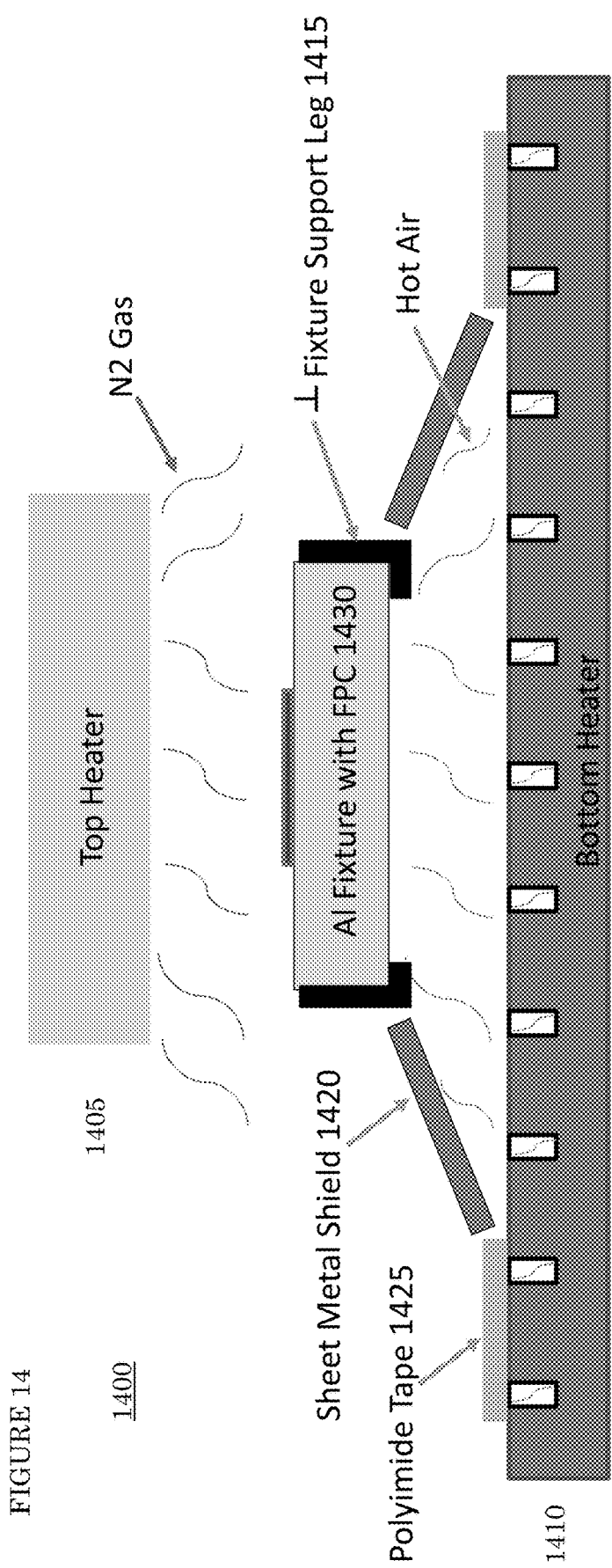
FIG. 14 is an example schematic illustrating an hot air rework system in accordance with an embodiment.

FIG. 14 is an example schematic illustrating the HARS fixture 1400 in accordance with an embodiment. In general, and as further described herein below, the HARS fixture 1400 is designed to control the temperature in predetermined temperature ranges so that the first flexible circuit cable and the substrate are bonded together without affecting any electronic components or the integrity of the substrate.

In particular, in an embodiment using solder, the HARS sequence will use the appropriate amount of heat as described herein below to reflow the solder, and the solder will flow to the substrate through the gold bumps, and be contained by the column created by the multiple gold bumps on the substrate.

Although the description herein is with respect to solder, a conductive epoxy can be used. In the event conductive epoxy is printed or dispensed on the flexible circuit cable, then heat, ultraviolet (UV) light, or both is to cure the epoxy between the flexible circuit cable and substrate. The epoxy has a reduced risk of being squeezed and smeared to neighboring pads because of the gap created by the gold bumps. That is, the epoxy is contained by the column created by the multiple gold bumps on the substrate.

Figure 15:
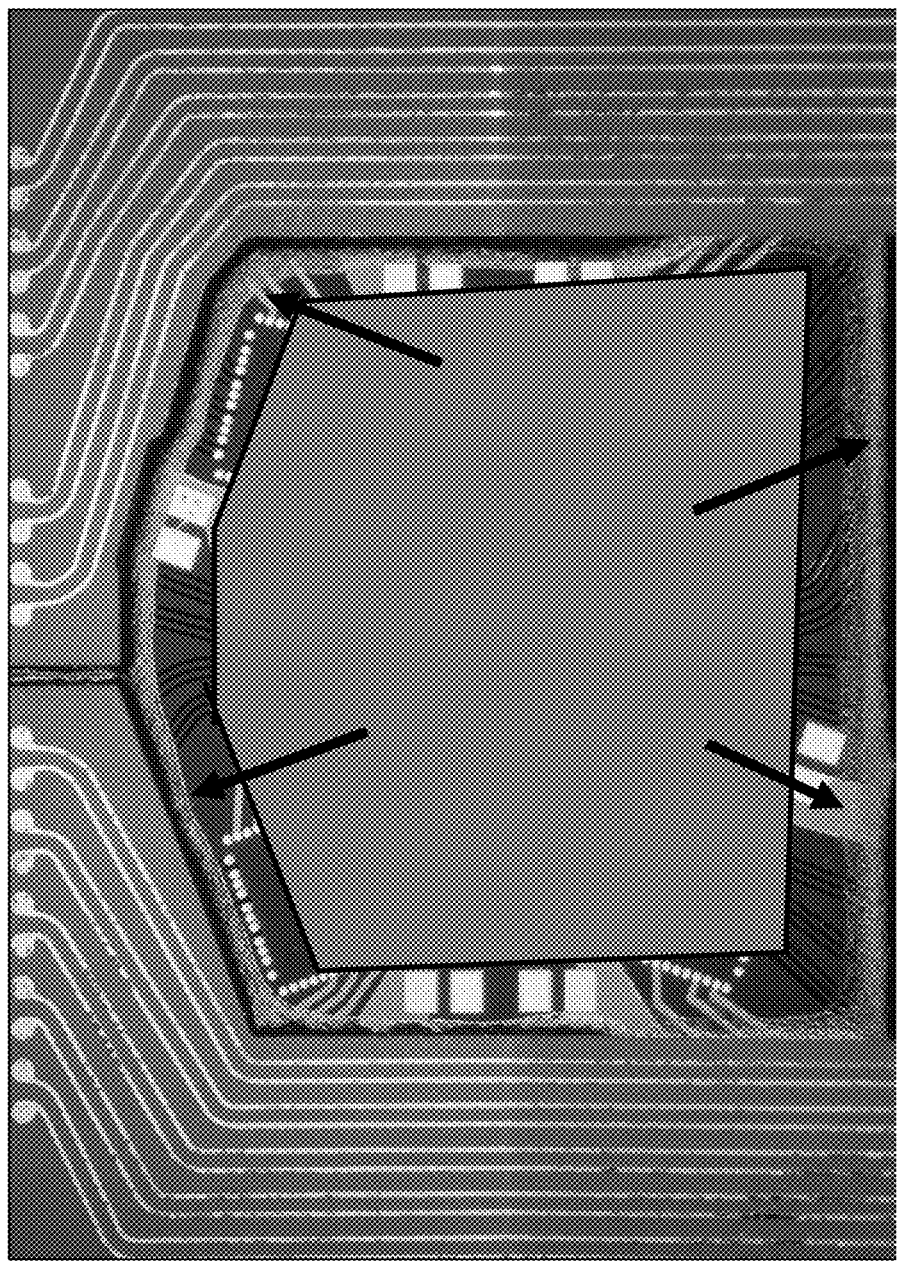
FIG. 15 is an example photograph showing underfill in accordance with an embodiment.

After completion of the HARS sequence, the first flexible circuit cable and the substrate are allowed to cool, and then underfill is applied and allowed to cure to increase the mechanical stability (330). In an embodiment, the underfill is a non-conductive underfill epoxy. The underfill is applied to the flexible circuit cable edge next to the substrate. Heat and capillary effects draw the underfill epoxy between the flexible circuit cable and the substrate. Application of the underfill epoxy is stopped if a fillet is formed around the edge of the flexible circuit cable. The heat is applied through a heat block built into the holding fixture, or through convention heating. FIG. 15 is an example photograph showing underfill in accordance with an embodiment. The first flexible circuit cable attachment to the substrate may then be examined using, for example, X-rays (335).

Figure 16:
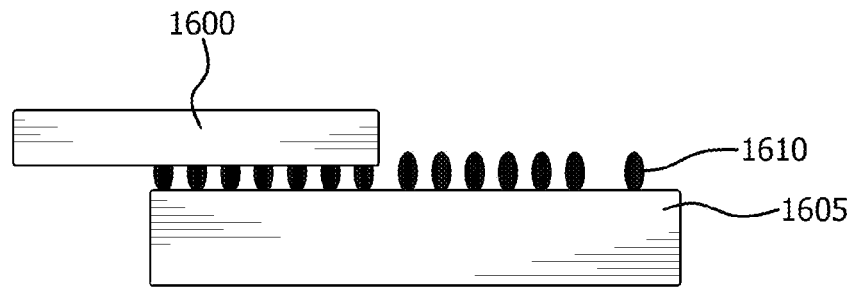
FIG. 16 shows an example of a first flexible circuit cable attached to a substrate in accordance with an embodiment.

FIG. 16 shows an example of a first flexible circuit cable attached to a substrate in accordance with an embodiment. In particular, the first flexible circuit cable 1600 is attached to a part of the substrate 1605 using a single row of gold bumps 1610.

Referring back to FIG. 3, solder bumps are printed on a second flexible circuit cable (340). For purposes of illustration only, the second flexible circuit cable is a large form flexible circuit cable. In an embodiment, the solder paste is Tin-Bismuth, although a variety of solder pastes can be used as the selection of the solder paste is dependent upon the application and other similar factors. The solder paste is applied to the flexible circuit cable using a stencil. The flexible circuit cable with the solder paste is then placed onto a hotplate at a predetermined temperature. The predetermined temperature can be 250° C., for example. The flexible circuit cable can be removed from the hotplate once the solder paste has fully reflowed (i.e. melted) and allowed to cool. The flexible circuit cable is placed into denatured alcohol and an ultrasonic bath for a predetermined or appropriate amount of time.

Figure 17:
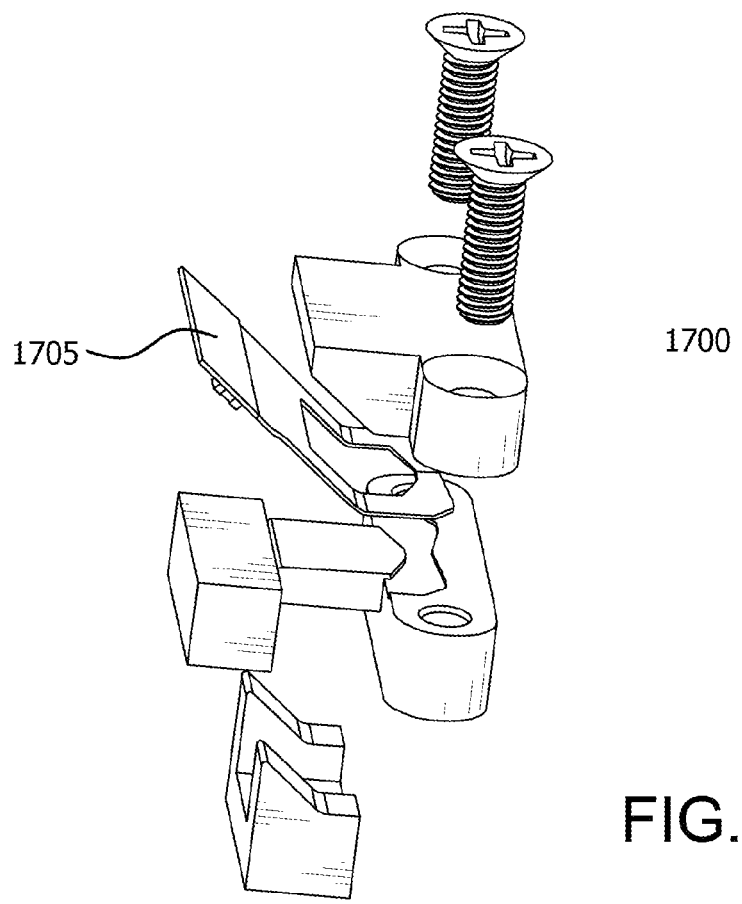
FIG. 17 is an example schematic illustrating a bending tool in accordance with an embodiment.

The second flexible circuit cable needs to be bent at a predetermined angle with respect to the interconnect pads and the rest of the second flexible circuit cable. The predetermined angle is sufficient to clear the second flexible cable circuit with respect to the first flexible circuit cable or other component carrying module. In an embodiment, the predetermined angle can be 35°. In another embodiment, the predetermined angle is between 35° and 60°. This may be done using a bending tool 1700 as shown in FIG. 17. In particular, a flexible circuit cable 1705 is placed in the bending tool 1700. The flexible circuit cable and the bending tool are then placed into an oven at a predetermined temperature for a predetermined amount of time. In an illustrative example, the predetermined temperature is 60° C. and the predetermined time is 1 hour. As before, if double bumping is needed, solder paste is applied over the reflowed solder paste to additional solder volume using the stencil. As before, solder paste is illustrative and conductive epoxy may be used.

Figure 18:
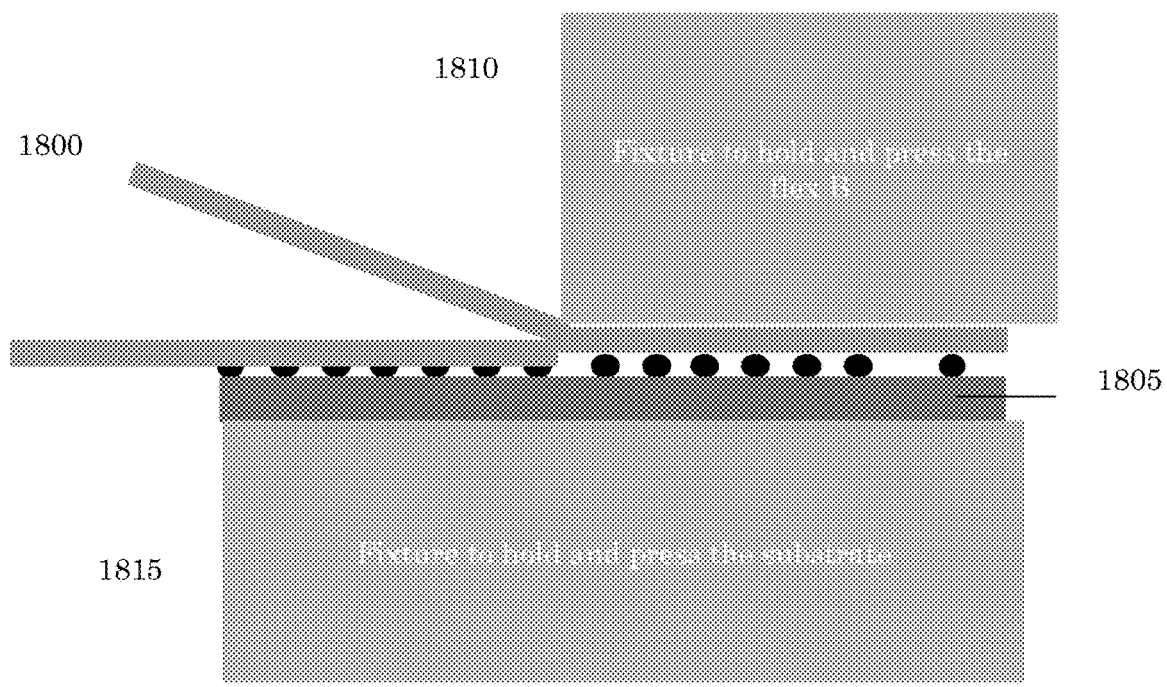
FIG. 18 shows an example of a second flexible circuit cable being attached to a substrate in accordance with an embodiment.

Referring back to FIG. 3, the second flexible circuit cable is placed into a hot air reflow system (HARS) fixture (345). The substrate and a weight are placed onto a pickup stage. The flexible circuit cable and substrate are positioned as shown in either FIG. 13A or 13B. FIG. 18 shows an example of a second flexible circuit cable 1800 being attached to a substrate 1805 in accordance with an embodiment. In particular, a fixture 1810 is placed on top of the second flexible circuit cable 1800 and a fixture 1815 is used to hold and press the substrate 1805.

After appropriate placement, the HARS sequence for the second flexible circuit cable and substrate in then initiated (350). A more detailed description of the HARS process is presented with respect to FIG. 26. As described above, after completion of the HARS sequence, the second flexible circuit cable and the substrate are allowed to cool, and then underfill is applied and allowed to cure to increase the mechanical stability (355). The second flexible circuit cable attachment to the substrate may then be examined using, for example, X-rays (360).

Figure 19:
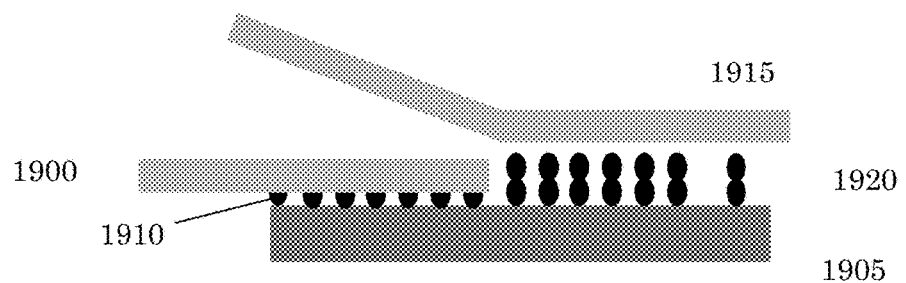
FIG. 19 shows an example of first and second flexible circuit cables attached to a substrate in accordance with an embodiment with two stacked gold bumps.

FIG. 19 shows an example of first and second flexible circuit cables attached to a substrate in accordance with an embodiment. In particular, a first flexible circuit cable 1900 is attached to a part of the substrate 1905 using a single stack of gold bumps 1910 and a second flexible cable circuit 1915 is attached to a part of the substrate 1905 using a double stack of gold bumps 1920.

Referring back to FIG. 14 and also to FIGS. 20-23, described herein is the HARS fixture 1400, and the various fixtures needed to implement the HARS processes for the first and second flexible circuit cables. The HARS fixture 1400 includes a top heater 1405, a bottom heater 1410, a fixture support leg 1415, sheet metal 1420 and polyimide tape 1425. The polyimide tape 1425 is used to cover all of the air holes on the bottom heater 1405 except near the center. This forces all of the air flow towards the center of the bottom heater 1405. The sheet metal 1420 contains the hot air by creating a chimney-type effect and directing the air towards a reflow fixture 1430 that also includes the flexible cable circuits. The reflow fixture 1430 is supported by the fixture support leg 1415, which is a perpendicular beam, suspended above the bottom heater 1410. The top heater sits a predetermined distance above the reflow fixture 1430 and provides hot $N_2$ gas. The top heater 1405 height and temperature are necessary to control solder temperature and the $N_2$ assists with solder wetting. The predetermined distance of the top heater 1405 can vary depending on application and materials and can be, for purposes of illustration only, 25 mm.

Figure 20A:
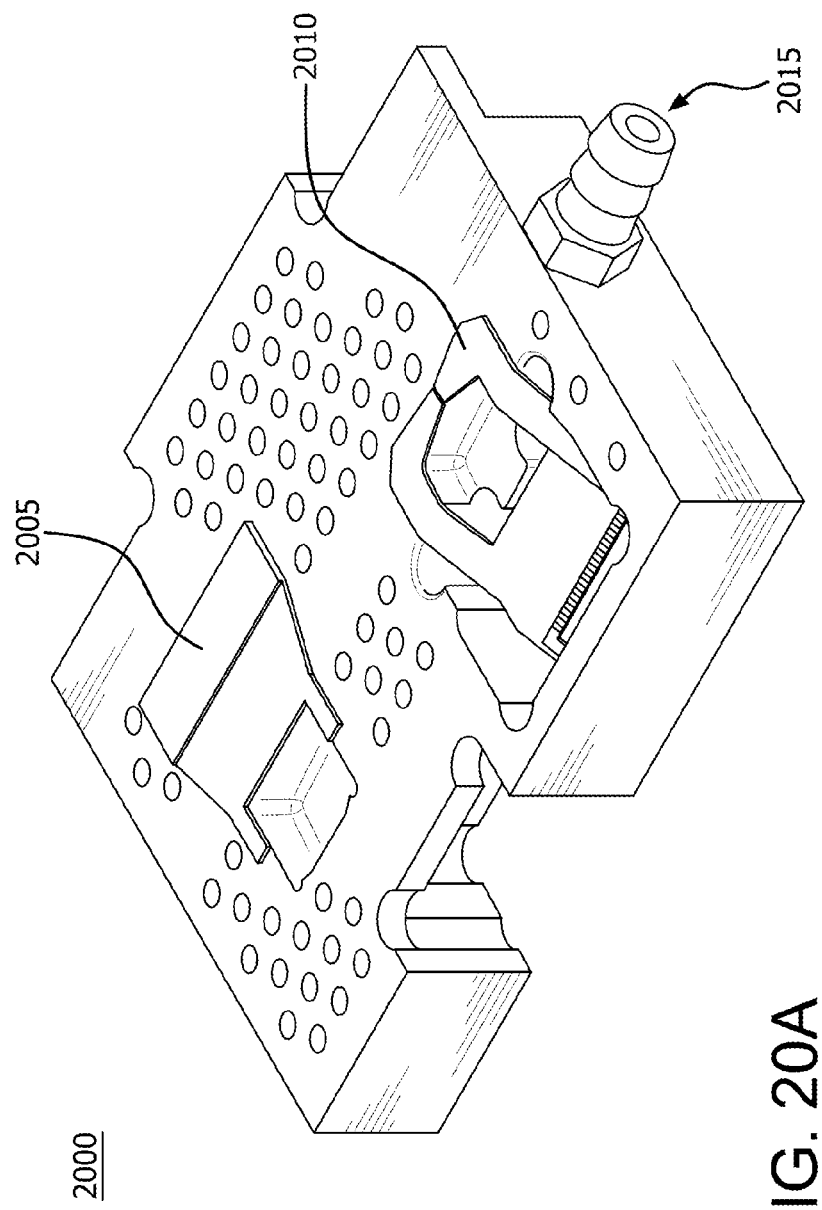
FIG. 20A is an example schematic illustrating a reflow fixture in accordance with an embodiment.
Figure 20B:
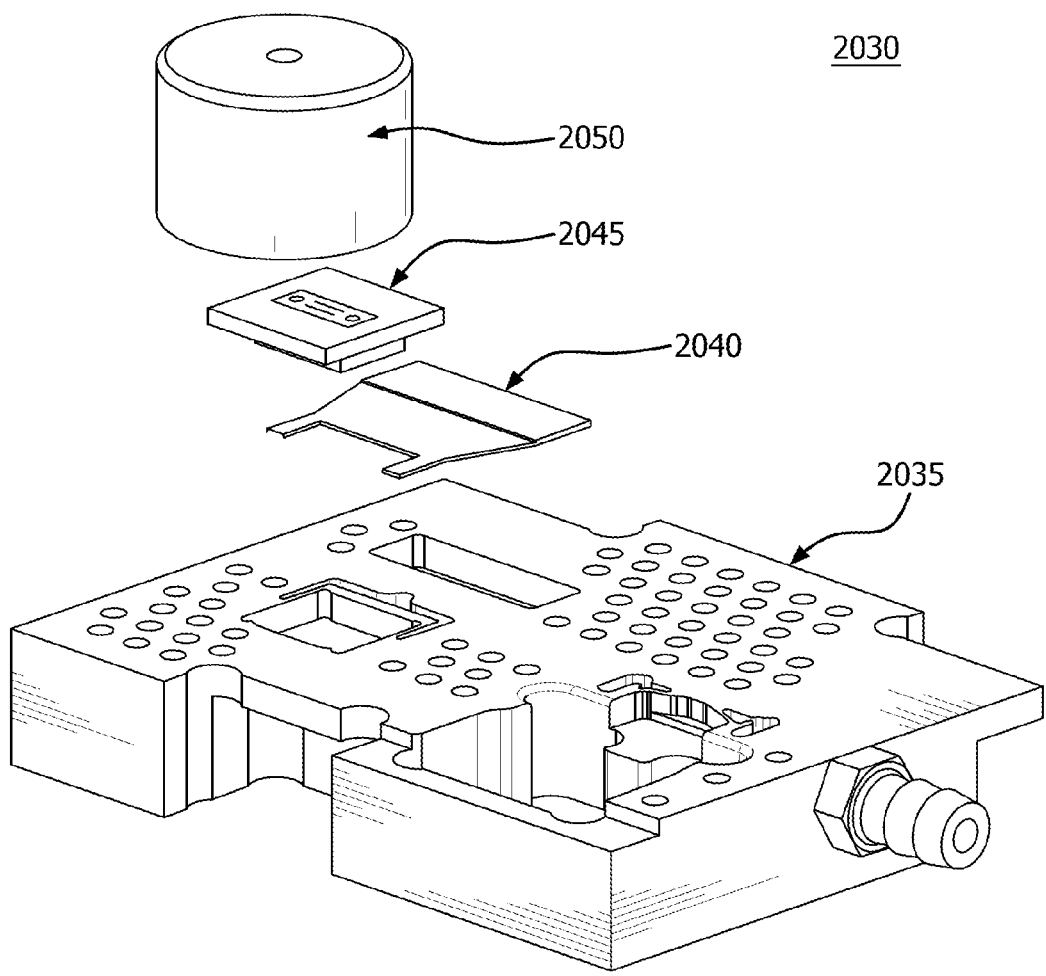
FIG. 20B is an example schematic illustrating an exploded first flexible circuit cable assembly in accordance with an embodiment.
Figure 20C:
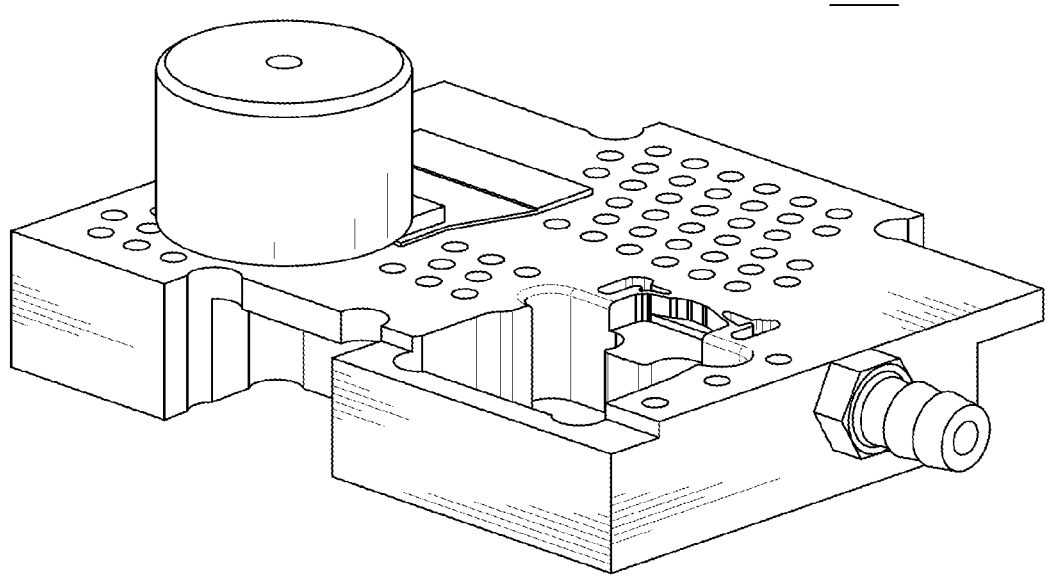
FIG. 20C is an example schematic illustrating an assembled first flexible circuit cable assembly in accordance with an embodiment.

FIG. 20A is an example schematic illustrating a reflow fixture 2000 in accordance with an embodiment. Moreover, FIG. 20A illustrates how a first flexible circuit cable 2005 and a second flexible circuit cable 2010 is positioned on the reflow fixture 2000. The reflow fixture 2000 has a vacuum line 2015 that is used to secure the first flexible circuit cable 2005 and the second flexible circuit cable 2010 during reflow. Various holes 2020 were made to assist with fixture pre-heating from a bottom heater. The reflow fixture 2000 can be made from a number of suitable materials including for purposes of illustration, aluminum. The substrate is blocked from all heated airflow to minimize shifting during reflow. The reflow fixture 2000 is also designed to fit the HARS fixture position clamps, (i.e. the fixture support leg 1415 in FIG. 14), to ensure consistent placement and position as shown in FIG. 14. FIG. 20B is an example schematic illustrating an exploded first flexible circuit cable assembly 2030 in accordance with an embodiment. The first flexible circuit cable assembly 2030 includes a reflow fixture 2035 as described herein above, a flexible circuit cable 2040, a substrate 2045 and a weight 2050. FIG. 20C is an example schematic illustrating an assembled first flexible circuit cable assembly 2060 using the elements described above in accordance with an embodiment.

Figure 21:
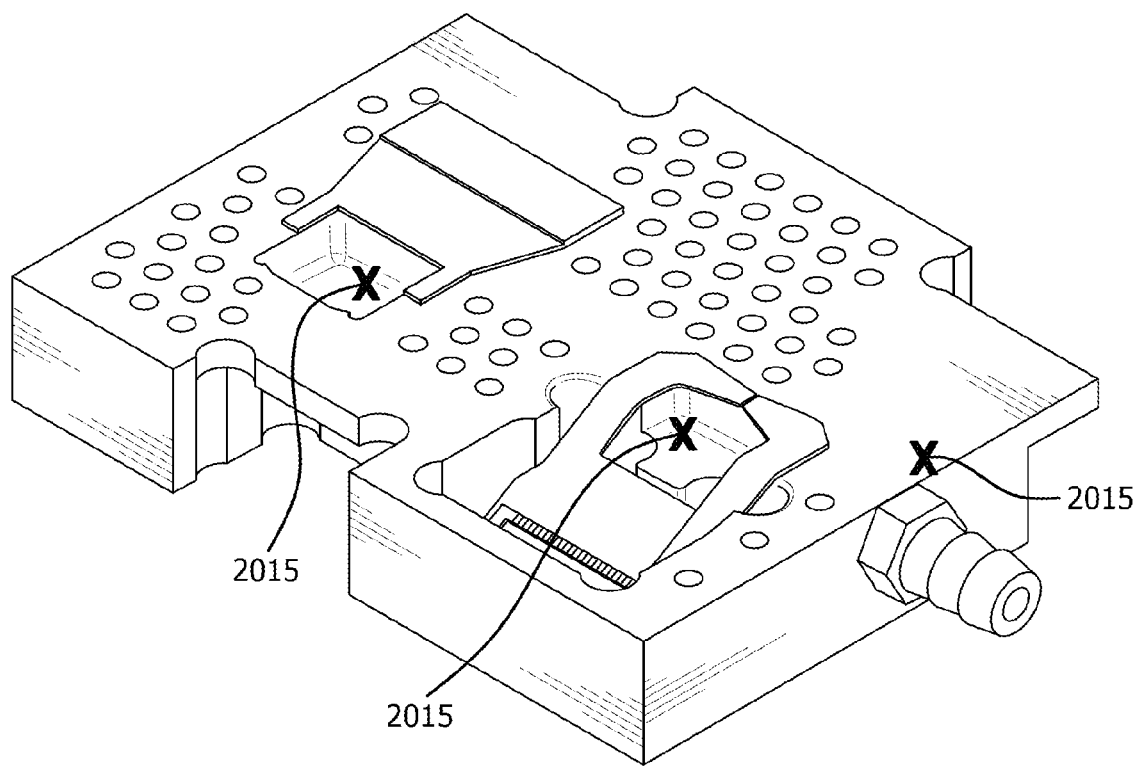
FIG. 21 is an example schematic illustrating a reflow fixture with thermocouples in accordance with an embodiment.

FIG. 21 is an example schematic illustrating a reflow fixture 2100 with thermocouples 2105 in accordance with an embodiment. In particular, each position marked by an "X" in FIG. 21 indicates thermocouple locations for thermal profiling. To simulate thermal mass for assembly, the substrate and a Tungsten block, (which is being used as the weight and further described herein below), are both placed, (as shown in FIGS. 20B and 20C), when determining the thermal profile. A thermocouple was placed on the reflow fixture 2100 as a conditioning mark to trigger changes with the bottom and top heaters.

Figure 22A:
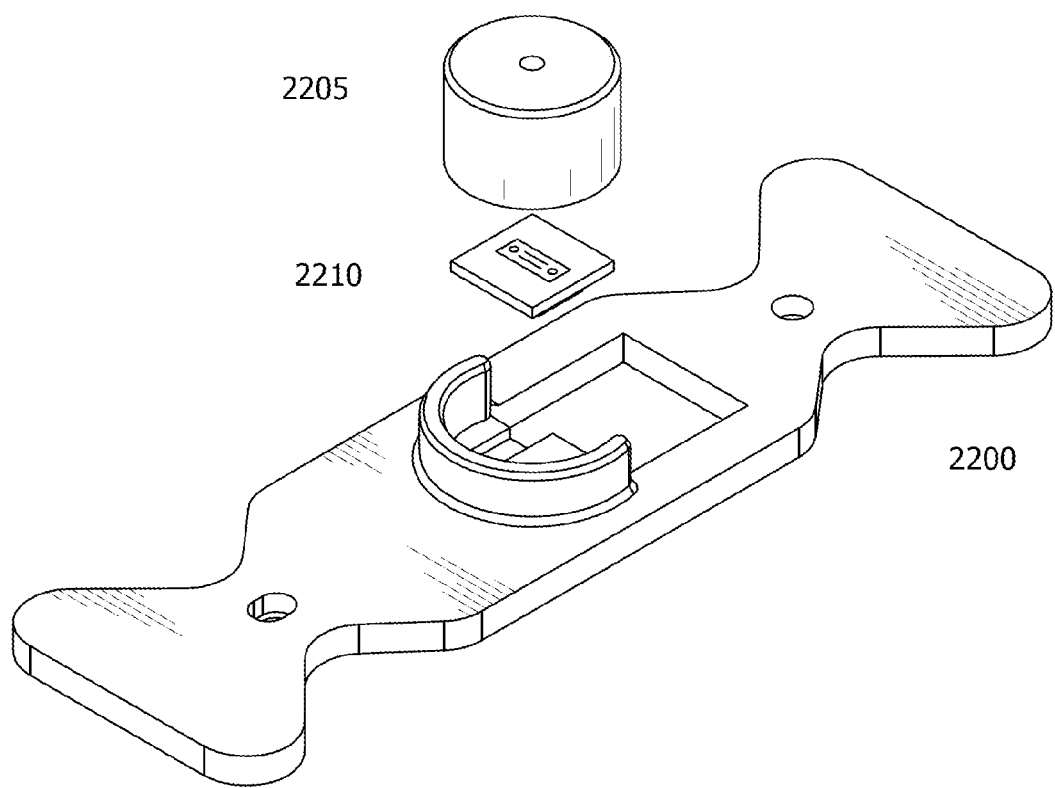
FIG. 22A is an example schematic illustrating a pickup stage and weight in accordance with an embodiment.
Figure 22B:
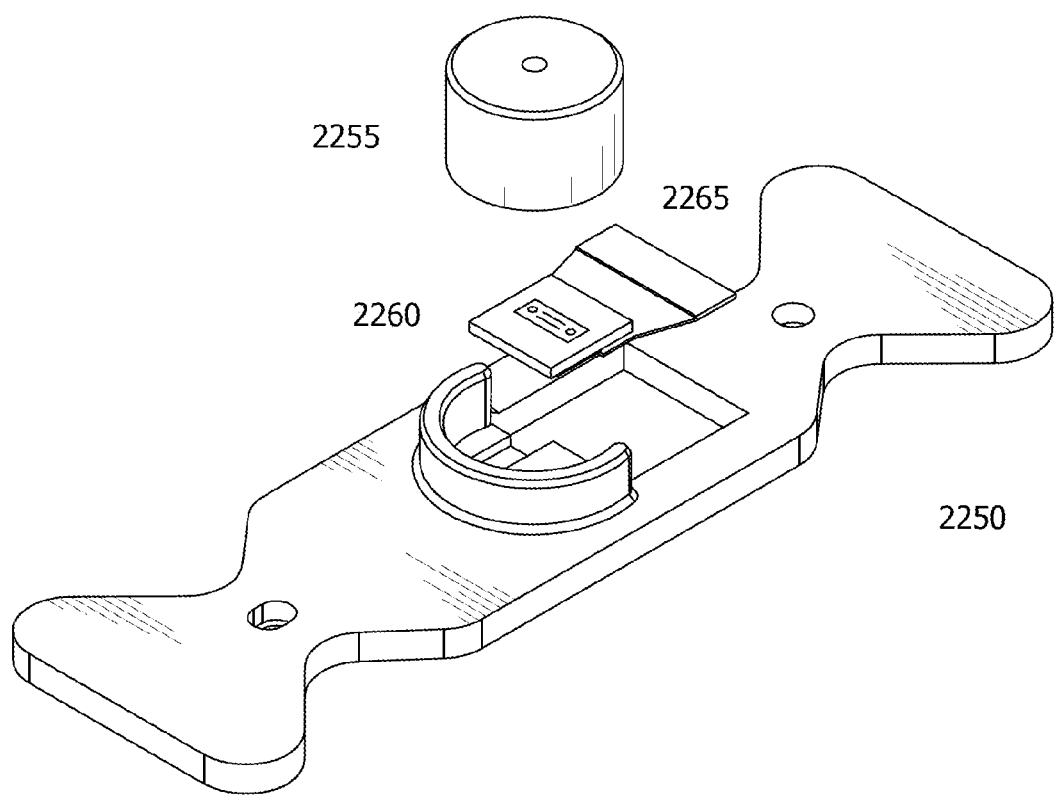
FIG. 22B is an example schematic illustrating a pickup stage, weight and assembled flexible circuit cable and substrate in accordance with an embodiment.

FIG. 22A is an example schematic illustrating a HARS pickup stage 2200, weight 2205 and substrate 2210 in accordance with an embodiment. The HARS pickup stage 2200 is designed to prepare the substrate 2210 and the weight 2205, (e.g., a Tungsten block), to be picked simultaneously and in a consistent position. FIG. 22B is an example schematic illustrating a pickup stage 2250, weight 2255, and an assembled flexible circuit cable 2265 and substrate 2260 in accordance with an embodiment.

Figure 23:
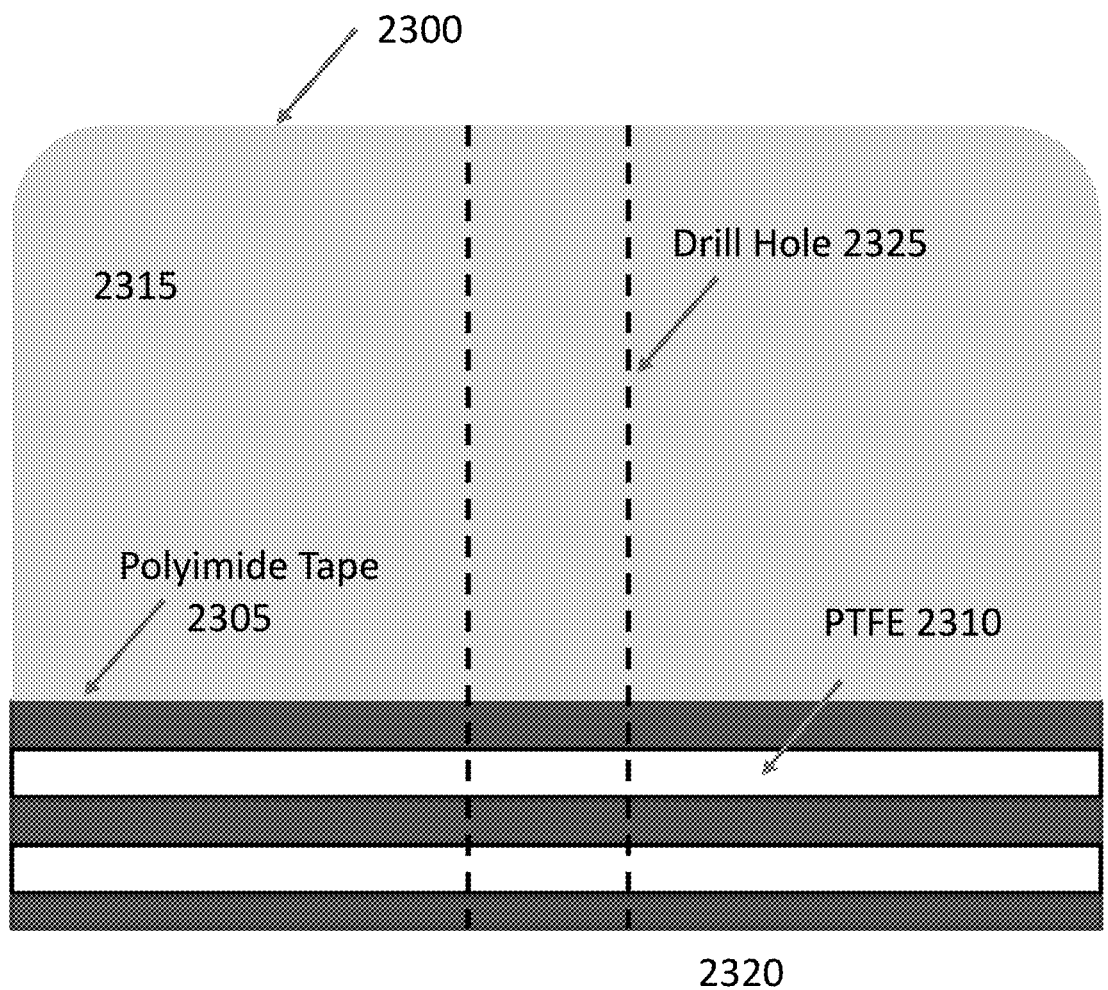
FIG. 23 is an example schematic illustrating a weight in accordance with an embodiment.

FIG. 23 is an example schematic illustrating a weight 2300 in accordance with an embodiment. In addition to the vacuum channel securing the flexible circuit cables to the reflow fixture, a weight is applied onto the substrate during the hot air reflow process. The main part of the weight 2300, can be, but is not limited to, a Tungsten block. Other metals may be used depending upon application. The weight 2300 consists of alternating layers of double-sided polyimide 2305 and Polytetrafluoroethylene (PTFE) 2310 which are added to provide thermal insulation between the tungsten block 2315 and a substrate. The outer layer consists of single-sided polyimide layer 2320. To provide suction, hole 2325 was drilled through the tungsten block 2300 and insulating layers 2305, 2310 and 2320. The hole can be, but is not limited to, a 2 mm hole. This allows the weight 2300 and the substrate to be picked and placed simultaneously by a HARS pickup tube, (not shown), as is commonly known. In an embodiment, the weight 2300 may have a 33 g tungsten block, 0.14 mm thick double-sided polyimide tape (2×), 0.14 mm thick PTFE (2×) and 0.03 mm thick single-sided polyimide (1×).

Figure 24:
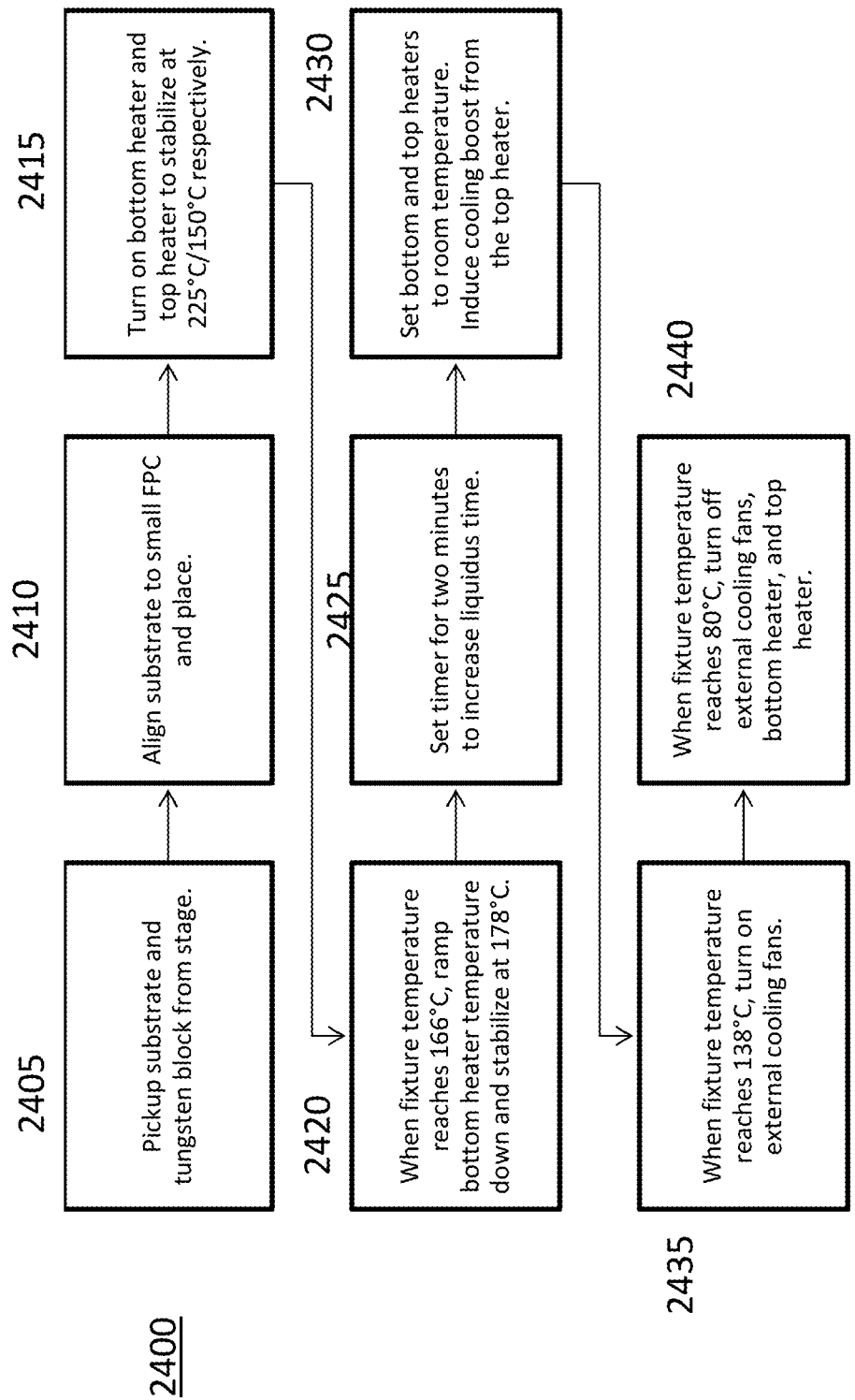
FIG. 24 is a top level flow diagram of attaching a first flexible circuit cable to a substrate in accordance with an embodiment.

FIG. 24 is a top level flow diagram 2400 of attaching a first flexible circuit cable to a substrate in accordance with an embodiment. A substrate and weight are picked up from a HARS pickup stage (2405). The substrate and a flexible circuit cable, (e.g. small form flexible circuit cable), are aligned and placed in a HARS fixture (2410). Referring now also to FIG. 14, a bottom heater 1410 and a top heater 1405 are turned on and stabilized to 225° C. and 150° C., respectively (2415). The temperatures are illustrative and other temperatures may be appropriate depending upon application. When reflow fixture 1430 reaches a predetermined temperature, (for purposes of illustration this may be 166° C. but may vary depending upon application), the bottom heater 1410 temperature is ramped down and stabilized at another predetermined temperature, (which may be 178° C. but can vary depending upon application) (2420). A timer is set for two minutes to increase liquidus time (2425). The timer time is illustrative and other times may be used based application and materials used. After expiration of the timer, the bottom heater 1410 and top heater 1405 are set to room temperature and a cooling boost is induced from the top heater 1405 (2430). When reflow fixture 1430 temperature reaches 138° C., external cooling fans are turned on (2535). When reflow fixture 1430 temperature reaches 80° C., the external cooling fans, bottom heater 1410, and top heater 1405 are turned off (2440).

Figure 25:
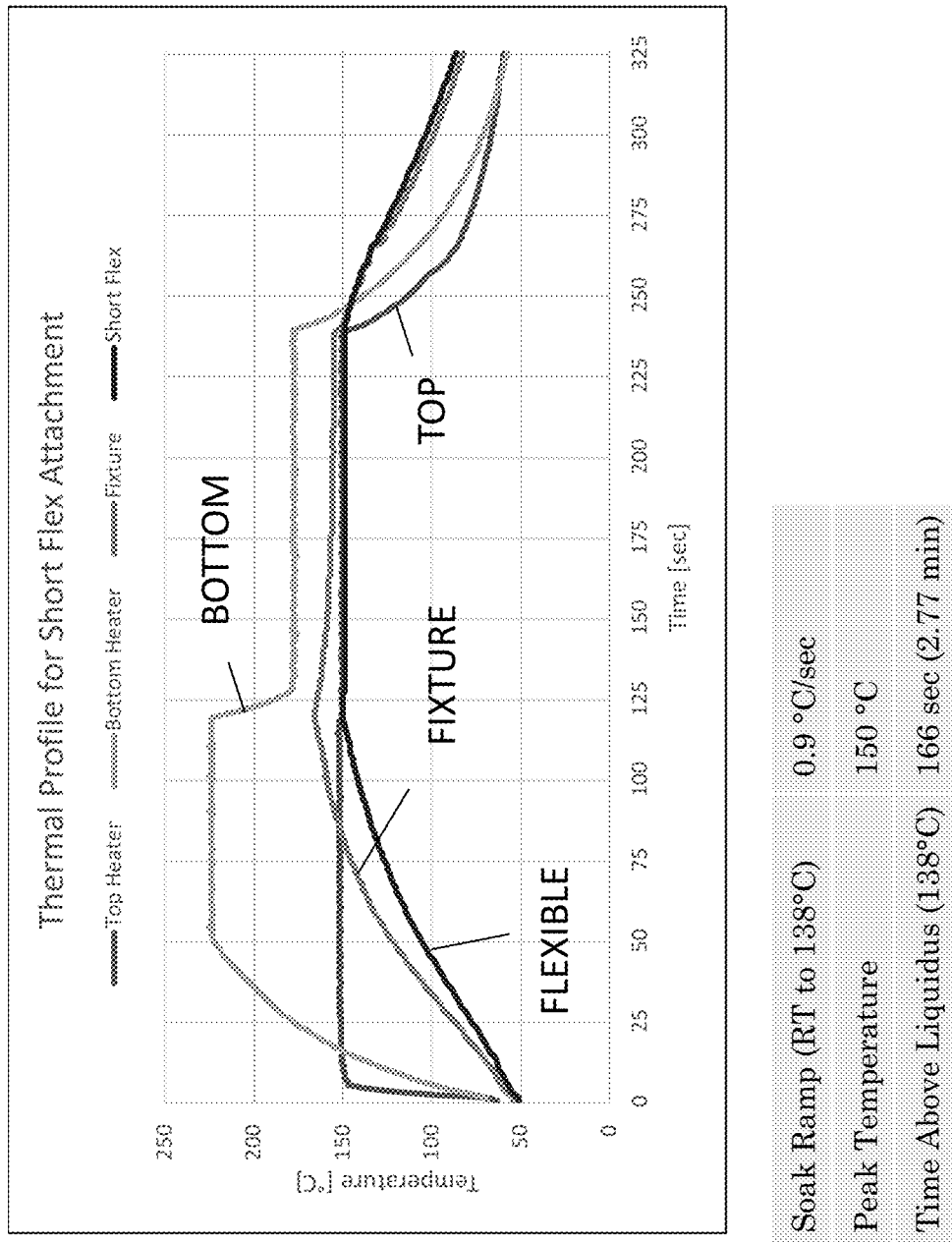
FIG. 25 is an illustrative temperature profile for attaching a first flexible circuit cable to a substrate in accordance with an embodiment.

FIG. 25 is an illustrative temperature profile for attaching the first flexible circuit cable to the substrate in accordance with an embodiment. The temperatures and temperature ranges described herein allow fast attainment of the reflow temperature before flux burns out in the solder. The flux reduces oxides and the oxides need to be low to achieve sufficient binding. Moreover, as illustrated in FIG. 25, the methods described herein allow for operating in a narrow thermal window so as to achieve the binding without damaging the components. The temperatures stated in the embodiment herein are illustrative for the application and materials used herein. Other temperatures may be used without departing from the scope of the claims.

Figure 26:
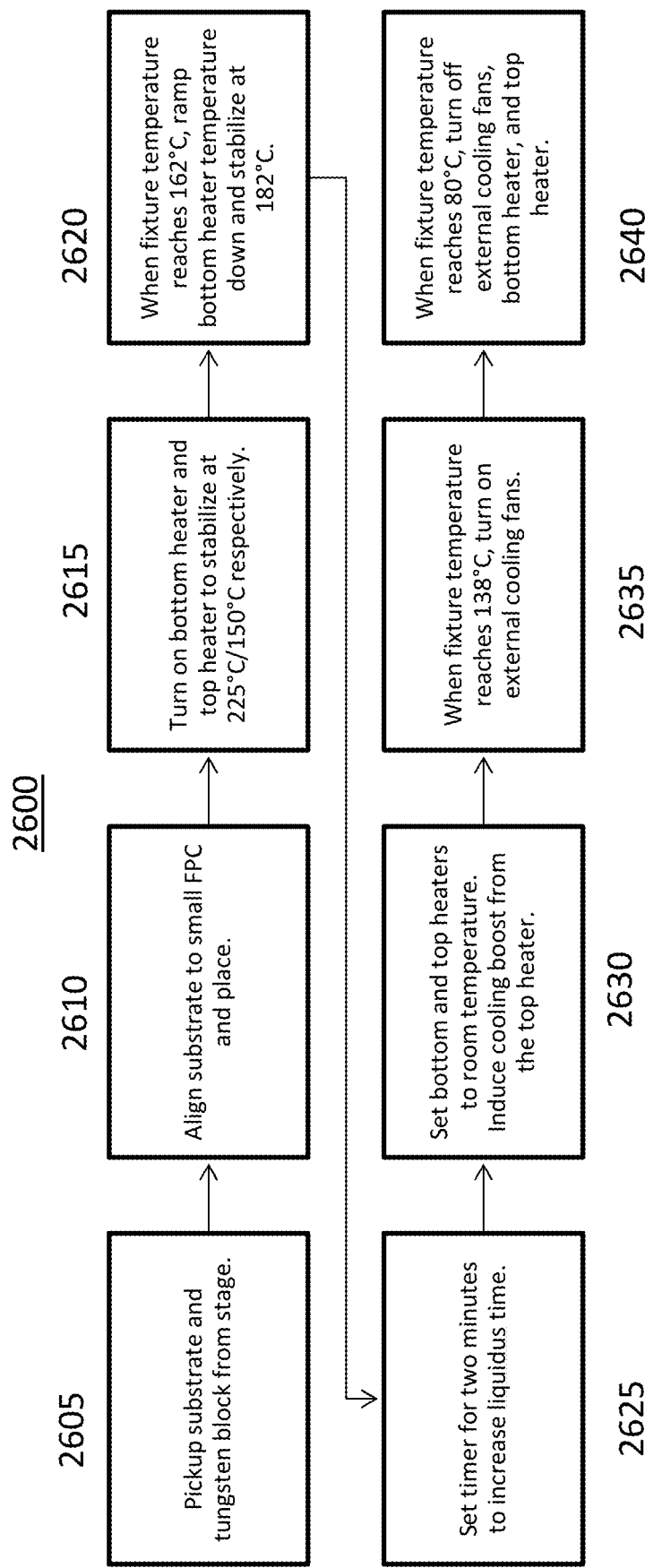
FIG. 26 is a top level flow diagram of attaching a second flexible circuit cable to a substrate in accordance with an embodiment.
Figure 27:
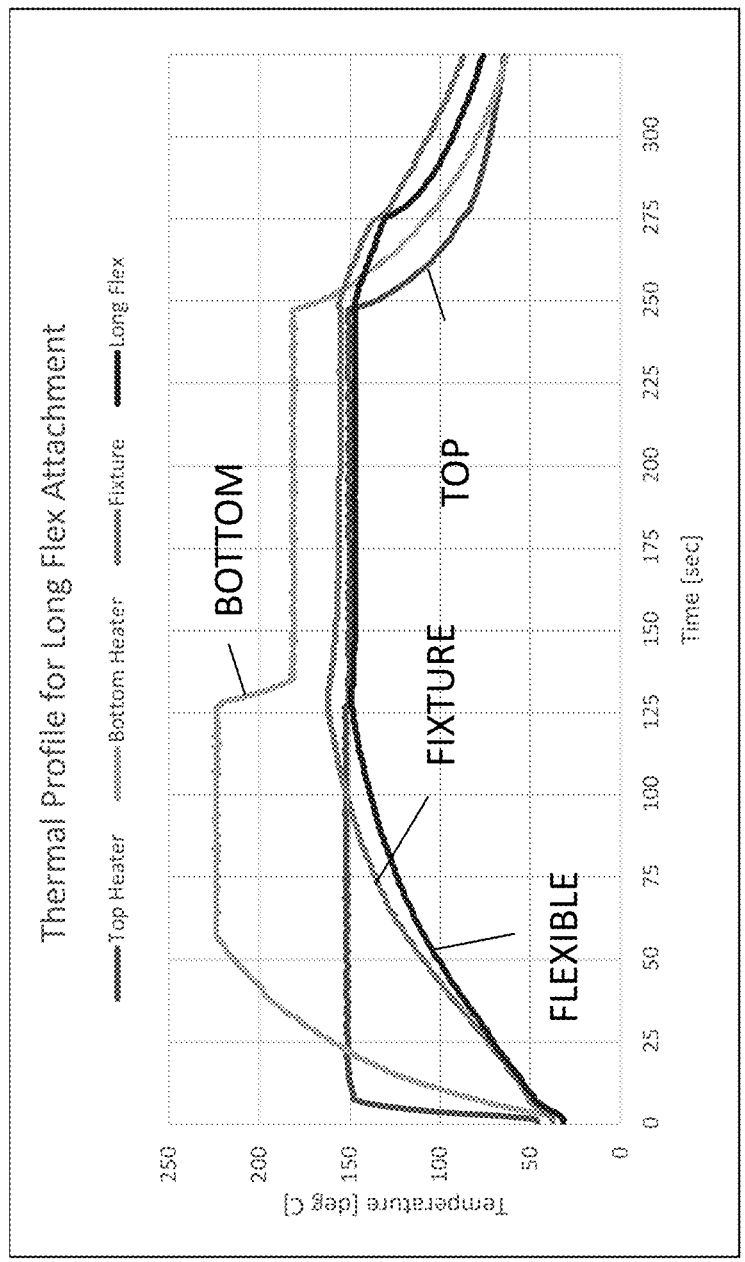
FIG. 27 is an illustrative temperature profile for attaching a second flexible circuit cable to a substrate in accordance with an embodiment.
Figure 28:
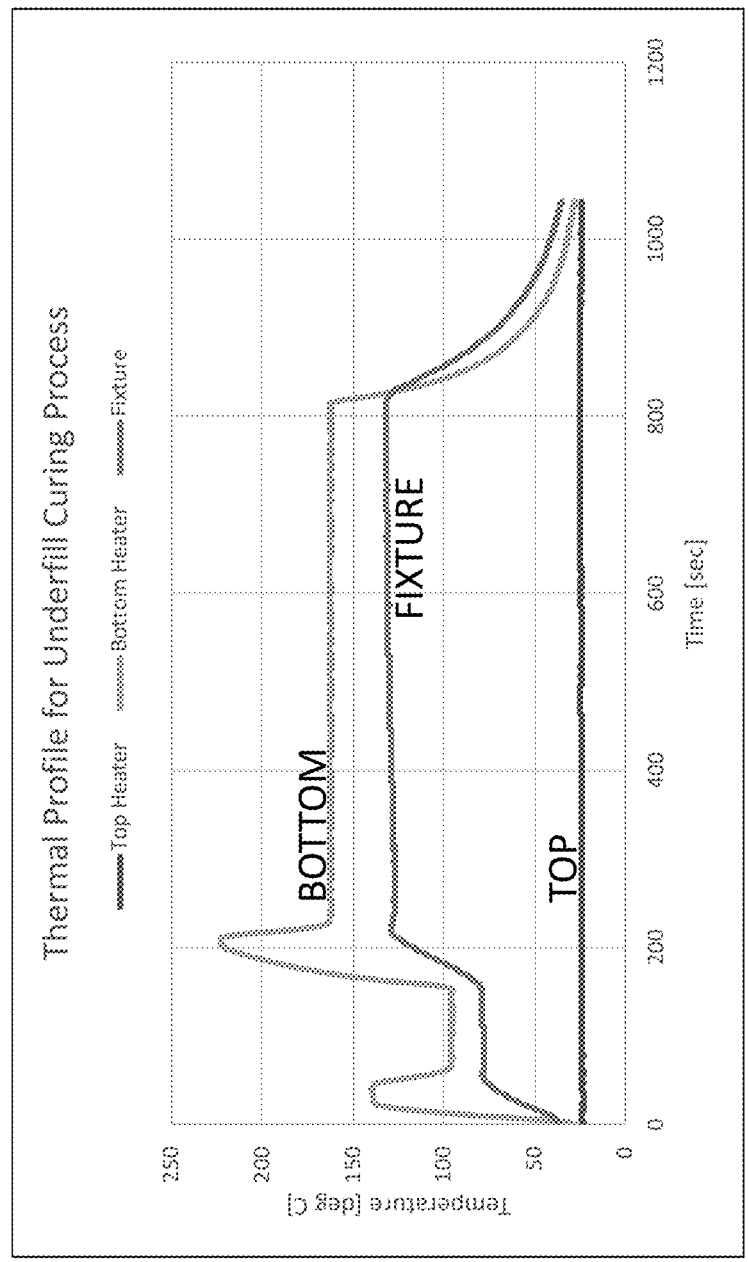
FIG. 28 is an illustrative temperature profile for an underfill curing process in accordance with an embodiment.

FIG. 26 is a top level flow diagram 2600 of attaching a second flexible circuit cable to a substrate in accordance with an embodiment. A substrate and weight are picked up from a HARS pickup stage (2605). The substrate and a flexible circuit cable, (e.g. large form flexible circuit cable), are aligned and placed in a HARS fixture (2610). Referring now also to FIG. 14, a bottom heater 1410 and a top heater 1405 are turned on and stabilized to 225° C. and 150° C., respectively (2615). The temperatures are illustrative and other temperatures may be appropriate depending upon application. When reflow fixture 1430 reaches a predetermined temperature, (for purposes of illustration this may be 162° C. but may vary depending upon application), the bottom heater 1410 temperature is ramped down and stabilized at another predetermined temperature, (which may be 182° C. but can vary depending upon application) (2620). A timer is set for two minutes to increase liquidus time (2625). The timer time is illustrative and other times may be used based application and materials used. After expiration of the timer, the bottom heater 1410 and top heater 1405 are set to room temperature and a cooling boost is induced from the top heater 1405 (2630). When reflow fixture 1430 temperature reaches 138° C., external cooling fans are turned on (2535). When reflow fixture 1430 temperature reaches 80° C., the external cooling fans, bottom heater 1410, and top heater 1405 are turned off. FIG. 27 is an illustrative temperature profile for attaching the second flexible circuit cable to the substrate in accordance with an embodiment. The temperatures stated in the embodiment herein are illustrative for the application and materials used herein. Other temperatures may be used without departing from the scope of the claims.

As stated herein above, immediately after each flexible circuit cable attachment, an epoxy underfill is applied to add mechanical strength. The epoxy underfill can be cured while mounted on the HARS fixture to reduce risk to the flexible circuit cable attachment for the second flexible circuit cable attachment. A single droplet of the underfill material can be used for the first or small flexible circuit cable assembly and two droplets can be used required for the second or large flexible circuit cable assembly. The number of drops is illustrative and may vary in accordance with application and materials used. Referring back to FIG. 15, the arrows indicate underfill material post-cured. In an illustrative embodiment, the underfill is a ball grid array (BGA) underfill and can be applied at 80° C. and cured at 130° C. for more than 8 minutes. The materials, time and temperatures are illustrative and other values may be used without departing from the scope of the claims. It is noted that the top heater may not be needed for underfill curing.

The methods and apparatus described herein can achieve flexible circuit cable attachment even when the flexible circuit cable has an irregular shape. For example, when the interconnection pads on the flexible circuit cable are located on a U shaped area. The methods overcome the co-planarity issue of the pads on a flexible circuit cable if the flexible circuit cable is pre-bent and the co-planarity is lost. The methods provide multiple flexible circuit cable attachment, and the flexible circuit cables can overlap each other. Moreover, the methods can overcome the space gaps created by pre-attached chips or flexible circuit cables.

The attachment temperature is low and will not impact pre-attached chips or flexible circuit cables. The methods reduce the attachment resistance between the flexible circuit cable and substrate with multiple gold bumps (or cu pillars), and therefore provides wider RF bandwidth and better signal integrity of the interconnection than other attachment techniques. For example, solderable conductive epoxy SMT138 E has an electrical resistance of 1030 $\mu\Omega.cm$, which is about 10 times larger than that of the gold at 2.44 $\mu\Omega.cm$.

The methods can help improve crosstalk performance by using more than one flexible circuit cable instead of routing signals through a single flexible circuit cable. When high speed signals are placed too close to each other on a flexible circuit cable, crosstalk between the signal lanes on the same flexible circuit cable will occur. Therefore, it is an advantage to use more flexible circuit cables to transmit signals that require very low cross talk, such as the high speed signals to drive the optical transmitters and the high speed signals from the optical receivers. The methods provide a high density, high throughput, wide bandwidth signal fan-out solution from a small substrate or interposer. The method can reduce the pad size and pitch on the substrate and flexible circuit cable, and therefore increase interconnection density greater than any of the existing flexible circuit cable attachment solutions.

The method increases attachment reliability because the solder or conductive epoxy are contained by the gold bumps, and will not smear into neighboring pads. The method reduces attachment process time because soldering and underfill can be performed at the same time.

In summary, the gold bumping allows for: 1) flexible circuit cable attachment with limited co-planarity; 2) attachment of irregular shaped flexible circuit cables; 3) multiple flexible circuit cable attachments to same substrate (overcoming spacing created by stacking flexible circuit cable); 4) can use low temperature and pressure processes; 5) reduces electrical resistance between substrate and flexible circuit cable; 6) increased design flexibility; and 7) increase RF performance for high frequency applications.

In general, a method for flexible circuit cable attachment includes bonding a plurality of gold bumps to each interconnection pad of a plurality of interconnection pads on a substrate to create columns at each interconnection pad. A bonding material is dispensed on a first flexible circuit cable. The substrate and the first flexible circuit cable are aligned and forcibly pressed together, where the column restricts dispersion of the bonding material. A first set of predetermined levels of heat is applied to promote the bonding material to bond between the substrate and the first flexible circuit cable. In an implementation, the method includes bending a second flexible circuit cable with respect to the first flexible circuit cable, bonding another plurality of gold bumps to each interconnection pad of another plurality of interconnection pads on the substrate to create columns at each interconnection pad, dispensing a bonding material on the second flexible circuit cable, aligning and forcibly pressing the substrate and the second flexible circuit cable together, and applying a second set of predetermined levels of heat to promote the bonding material to bond between the substrate and the second flexible circuit cable. In an implementation, the first flexible circuit cable and the second flexible circuit cable are overlapping. In an implementation, the first predetermined levels of heat and the second predetermined levels of heat are controlled to affect bonding between the substrate and the first flexible cable and between the substrate and the second flexible circuit cable without affecting electronic components. In an implementation, the second predetermined levels of heat are controlled to affect bonding between the substrate and the second flexible cable without affecting electronic components and the bonding between the substrate and the first flexible circuit cable. In an implementation, a weight is used to forcibly press at least one of the substrate and first flexible circuit cable together and the substrate and second flexible circuit cable together. In an implementation, the weight is cantilevered off of at least the first flexible circuit cable to enhance compression and bonding. In an implementation, the bonding material is dispensed at least twice on the first flexible circuit cable. In an implementation, the method includes applying an underfill between the substrate and the first flexible circuit cable to provide mechanical strength. In an implementation, the plurality of gold bumps are laid out on each interconnection pad in a predetermined pattern.

In general, a system for attaching flexible circuit cables includes a substrate including a first set of interconnection pads, where a plurality of gold bumps are bonded to each interconnection pad to create a columnar structure. The system includes at least one flexible circuit cable, where a bonding material is dispensed on the at least one flexible circuit cable, an alignment device to align the substrate and the at least one flexible circuit cable, a weight to forcibly press together the substrate and the at least one flexible circuit cable, and a hot air reflow system (HARS) to apply a first set of predetermined levels of heat to promote the bonding material to bond between the substrate and the at least one flexible circuit cable, wherein the columnar structure restricts dispersion of the bonding material. In an implementation, another plurality of gold bumps are bonded to another set of interconnection pads to create additional columnar structures. In an implementation, the system further includes a bending tool, at least another flexible circuit cable, where the bending tool bends the at least another flexible circuit cable with respect to the at least one flexible circuit cable and where bonding material is dispensed on the at least another flexible circuit cable, the alignment device aligning the substrate and the at least another flexible circuit cable, the weight forcibly pressing the substrate and the at least another flexible circuit cable together and the HARS applying a second set of predetermined levels of heat to promote the bonding material to bond between the substrate and the at least another flexible circuit cable. In an implementation, the at least one flexible circuit cable and the at least another flexible circuit cable are overlapping. In an implementation, the first predetermined levels of heat and the second predetermined levels of heat are controlled to affect bonding between the substrate and the at least one flexible cable and between the substrate and the at least another flexible circuit cable without affecting electronic components. In an implementation, the second predetermined levels of heat are controlled to affect bonding between the substrate and the at least another flexible cable without affecting electronic components and the bonding between the substrate and the at least one flexible circuit cable. In an implementation, the weight is cantilevered off of at least the at least one flexible circuit cable and the at least another flexible circuit cable to enhance compression and bonding. In an implementation, the bonding material is dispensed at least twice on at least one of the at least one flexible circuit cable and the at least another flexible circuit cable. In an implementation, an underfill is applied between the substrate and the at least one flexible circuit cable and between the substrate and the at least another flexible circuit cable to provide mechanical strength. In an implementation, the plurality of gold bumps and the another plurality of gold bumps are laid in a predetermined pattern. In an implementation, the HARS includes a plurality of heaters to provide the first set of predetermined levels of heat and the second set of predetermined levels of heat.

It is to be understood that the present invention is not limited to the embodiments described above, but encompasses any and all embodiments within the scope of the following claims. Additionally, although the features and elements of the present application are described in the example embodiments in particular combinations, each feature or element can be used alone (without the other features and elements of the example embodiments) or in various combinations with or without other features and elements of the present application.

What is claimed is:

1. A system for attaching flexible circuit cables comprising:
    a substrate including interconnection pads, wherein each interconnection pad has a columnar structure created from a plurality of bonded gold bumps;
    a flexible circuit cable having a bonding material;
    a hot air reflow system fixture configured to align a weight, the substrate, and the flexible circuit cable;
    the weight configured to forcibly press together the substrate and the flexible circuit cable when aligned on the hot air reflow system fixture; and
    a hot air reflow system configured to apply a set of predetermined levels of heat to promote the bonding material to bond between the substrate and the flexible circuit cable when aligned on the hot air reflow system fixture with the weight,
    wherein the columnar structure restricts dispersion of the bonding material.

2. The system of claim 1, further comprising:
    additional interconnection pads on the substrate, wherein each additional interconnection pad has additional columnar structure created from another plurality of bonded gold bumps;
    a bent flexible circuit cable having a bonding material;
    the hot air reflow system fixture configured to align the weight, the substrate, and the bent flexible circuit cable on the hot air reflow system fixture;
    the weight configured to forcibly press together the substrate and the bent flexible circuit cable when the bent flexible circuit cable covers the additional interconnection pads; and
    the hot air reflow system configured to apply a second set of predetermined levels of heat to promote the bonding material of the bent flexible circuit cable to bond between the substrate and the bent flexible circuit cable when aligned on the hot air reflow system fixture with the weight.

3. The system of claim 2, wherein the flexible circuit cable and the bent flexible circuit cable are overlapping on the substrate.

4. The system of claim 2, wherein the first set of predetermined levels of heat and the second set of predetermined levels of heat are controlled to affect bonding between the substrate and the flexible circuit cable and between the substrate and the bent flexible circuit cable without affecting electronic components.

5. The system of claim 2, wherein the second set of predetermined levels of heat are controlled to affect bonding between the substrate and the bent flexible circuit cable without affecting electronic components and the bonding between the substrate and the flexible circuit cable.

6. The system of claim 2, wherein the flexible circuit cable is pressed against the interconnection pads on the substrate and the bent flexible circuit cable is pressed against the additional interconnection pads on the substrate, further comprising:
the weight configured to cantilever off of at least the flexible circuit cable and the bent flexible circuit cable to enhance compression and bonding while in the hot air reflow system fixture during heat application by the hot air reflow system.

7. The system of claim 2, wherein the bonding material is dispensed at least twice on at least one of the flexible circuit cable or the bent flexible circuit cable.

8. The system of claim 2, wherein the flexible circuit cable is pressed against the interconnection pads on substrate and the bent flexible circuit cable is pressed against the additional interconnection pads on the substrate and an underfill is situated between the substrate and the flexible circuit cable and between the substrate and the bent flexible circuit cable to provide mechanical strength.

9. The system of claim 8, wherein the bonded gold bumps on the interconnection pads and the bonded gold bumps on the additional interconnection pads provide a stand-off height for dispensing the underfill.

10. The system of claim 2, wherein the bonded gold bumps on the interconnection pads and the bonded gold bumps on the additional interconnection pads are in a predetermined pattern.

11. The system of claim 2, wherein the hot air reflow system includes a plurality of heaters to provide the first set of predetermined levels of heat and the second set of predetermined levels of heat.

12. A system for attaching flexible circuit cables, the method comprising:
a substrate including interconnection pads, wherein each interconnection pad has a column created from at least two bonded gold bumps;
a flexible circuit cable;
a hot air reflow system fixture configured to align a weight, the substrate, and the flexible circuit cable;
the weight configured to forcibly press together the substrate and the flexible circuit cable when aligned on the hot air reflow system fixture; and
a hot air reflow system configured to apply predetermined levels of heat to promote a bonding material on the flexible circuit cable to bond between the substrate and the flexible circuit cable when aligned on the hot air reflow system fixture with the weight,
wherein each column restricts dispersion of the bonding material.

13. The system of claim 12, further comprising:
additional interconnection pads on the substrate, wherein each additional interconnection pad has additional column created from at least two bonded gold bumps;
a bent flexible circuit cable;
the hot air reflow system fixture configured to align a weight, the substrate, and the bent flexible circuit cable;
the weight configured to forcibly press together the substrate and the bent flexible circuit cable when the bent flexible circuit cable covers the additional interconnection pads; and
the hot air reflow system configured to apply other predetermined levels of heat to promote a bonding material of the bent flexible circuit cable to bond between the substrate and the bent flexible circuit cable when aligned on the hot air reflow system fixture with the weight.

14. The system of claim 13, wherein the flexible circuit cable and the bent flexible circuit cable are overlapping on the substrate.

15. The system of claim 13, wherein the predetermined levels of heat and the other predetermined levels of heat are controlled to affect bonding between the substrate and the flexible circuit cable and between the substrate and the bent flexible circuit cable without affecting electronic components.

16. The system of claim 13, wherein the other predetermined levels of heat are controlled to affect bonding between the substrate and the bent flexible circuit cable without affecting electronic components and the bonding between the substrate and the flexible circuit cable.

17. The system of claim 13, wherein the flexible circuit cable is pressed against the interconnection pads on the substrate and the bent flexible circuit cable is pressed against the additional interconnection pads on the substrate, further comprising:
the weight configured to cantilever off of at least the at flexible circuit cable and the bent flexible circuit cable to enhance compression and bonding while in the hot air reflow system fixture during heat application by the hot air reflow system.

18. The system of claim 13, further comprising:
dispensing the respective bonding material at least twice on at least one of the flexible circuit cable or the bent flexible circuit cable.

19. The system of claim 13, wherein the flexible circuit cable is pressed against the interconnection pads on substrate and the bent flexible circuit cable is pressed against the additional interconnection pads on the substrate and an underfill is situated between the substrate and the flexible circuit cable and between the substrate and the bent flexible circuit cable to provide mechanical strength.

20. The system of claim 13, wherein the hot air reflow system includes a plurality of heaters to provide the predetermined levels of heat and the other predetermined levels of heat.

* * * * *